US 6,620,561 B2

(12) United States Patent
Winder et al.

(10) Patent No.: US 6,620,561 B2
(45) Date of Patent: *Sep. 16, 2003

(54) METHOD FOR DESIGNING PHOTOLITHOGRAPHIC RETICLE LAYOUT, RETICLE, AND PHOTOLITHOGRAPHIC PROCESS

(76) Inventors: Amy A. Winder, P.O. Box AB, Idaho City, ID (US) 83631; Werner Juengling, 5660 S. Tecoma Pl., Boise, ID (US) 83701

(*) Notice: Subject to any disclaimer, the term of this patent is extended or adjusted under 35 U.S.C. 154(b) by 0 days.

This patent is subject to a terminal disclaimer.

(21) Appl. No.: 10/126,626

(22) Filed: Apr. 22, 2002

(65) Prior Publication Data

US 2002/0160278 A1 Oct. 31, 2002

Related U.S. Application Data

(62) Division of application No. 09/559,262, filed on Apr. 27, 2000, now Pat. No. 6,416,907.

(51) Int. Cl.[7] .................... G03F 9/00; G03F 17/50
(52) U.S. Cl. .............................. 430/5; 716/19
(58) Field of Search .................. 430/5; 716/19, 716/20, 21

(56) References Cited

U.S. PATENT DOCUMENTS 5,538,815 A    7/1996   Oi et al.
5,883,813 A    3/1999   Kim et al.
6,057,063 A    5/2000   Liebmann et al.
6,185,727 B1   2/2001   Liebmann
6,238,824 B1 * 5/2001   Futrell et al. .................. 430/5

OTHER PUBLICATIONS

Gerald Glan et al., "Alternating Phase Shift Generation for Complex Circuit Designs," SPIE vol. 2884, pp. 508–519, Sep. 1996.

* cited by examiner

Primary Examiner—S. Rosasco

(57) ABSTRACT

There are provided methods of creating a phase shift mask, comprising storing a file representing a binary mask layout as one or more cells, or as a hierarchy of a plurality of cells, at least some of which cells contain printable shapes; for each cell, determining if the cell contains a printable shape; if the cell has a printable shape, determining if the cell will print desired features in a wafer fabrication process and if so, leaving the cell alone; if the cell has a printable shape which will not print desired features in the wafer fabrication process, providing phase shift areas adjacent the printable shape so that it will print desired features; and using the cells to produce a phase shift mask. There are further provided embodiments of steps for generating such phase shift areas. In addition, there are provided photolithographic processes comprising directing exposure onto a resist through a mask formed using such methods. There are further provided systems comprising a computer readable storage medium containing program instructions for execution by a processor to design a mask; and a processor for executing the program instructions stored on the computer readable storage medium for performing such methods.

6 Claims, 24 Drawing Sheets

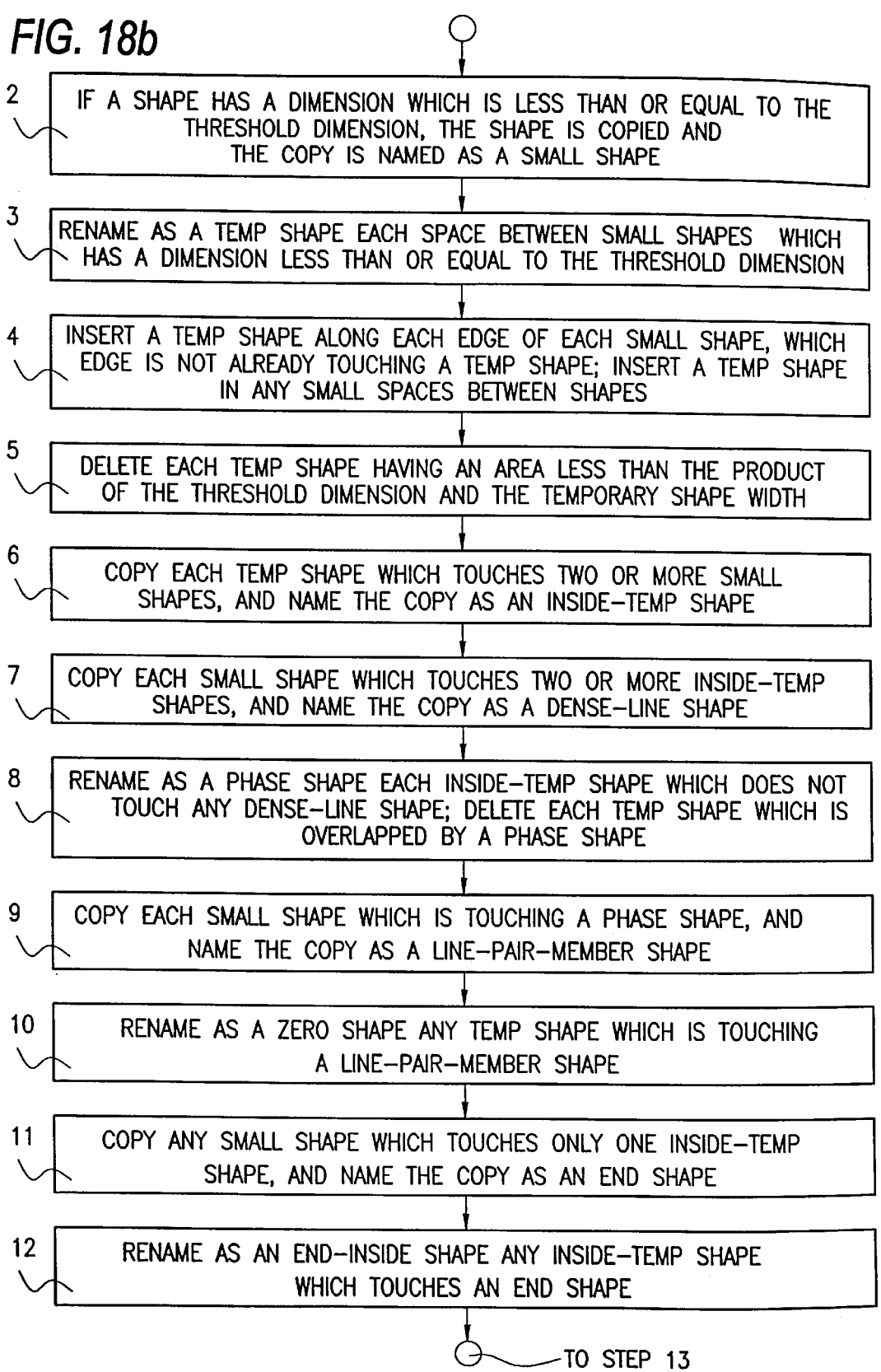

METHOD FOR DESIGNING PHOTOLITHOGRAPHIC RETICLE LAYOUT, RETICLE, AND PHOTOLITHOGRAPHIC PROCESS

This application is a divisional application of U.S. patent application Ser. No. 09/559,262, filed Apr. 27, 2000 now U.S. Pat. No 6,416,907, the entirety of which is incorporated herein by reference.

FIELD OF THE INVENTION

The present invention relates generally to the field of semiconductor fabrication, more particularly, to automated design of a reticle layout for use in manufacturing a reticle used in a photolithography process during semiconductor fabrication, and to a reticle made using such a design.

BACKGROUND OF THE INVENTION

In the manufacture of semiconductor chip devices, photolithographic processes are often used to pattern various layers on a wafer in order to produce circuit features positioned as specified in a circuit layout. In such processes, a layer of resist (also referred to as "photoresist") is deposited on the layer being patterned, and the resist is then exposed using an exposure tool and a template. These templates are known in the art as reticles or masks. For purposes of the present application, the term reticle includes both reticles and masks, and the two terms are interchangeable herein. During the exposure process, the reticle is imaged onto the resist by directing a form of radiant energy such as ultraviolet light through the reticle to selectively expose the resist in a desired pattern. The pattern which is produced in the resist is referred to herein as a "feature layout". One preferred device for creating such exposure is known as a "stepper".

One type of reticle which has been used is referred to as a binary reticle. A binary reticle includes reticle features, namely transparent features (areas through which exposure passes) and opaque features (areas which block exposure). The design of the reticle features is typically shown in a two-dimensional "binary reticle layout", although the reticle itself typically includes two or more layers (e.g., a transparent layer and a patterned opaque layer). The shape, orientation and position of each feature in a binary reticle typically correspond to the shape, orientation and position of the corresponding feature in the circuit layout. In use, radiant energy is directed toward the binary reticle, and the radiant energy is blocked by the opaque areas but passes through the transparent areas to pattern-wise expose the resist. After pattern-wise exposure, the resist is developed to remove either the exposed portions of the resist (a positive resist) or the unexposed portions of the resist (a negative resist), thereby forming a patterned resist on the layer being patterned. The patterned resist is then used to protect a corresponding pattern of underlying areas on the layer during a subsequent fabrication process or processes, such as deposition, etching or ion implantation processes. Thus, the patterned resist prevents or substantially prevents the effects of the fabrication process(es) from being produced in the layer in areas of the layer which lie beneath portions of the resist which have not been removed. The reticle is designed to expose the resist in a pattern which corresponds to the feature or features which are desired to be formed.

There are a number of effects caused by diffraction of exposure which tend to distort the patterns formed in a resist, i.e., which cause the pattern formed in a resist to differ from the binary reticle layout. Due to limitations imposed by the wavelength of light used to transfer the pattern, resolution degrades at the edges of the patterns of the reticle. Such degradation is caused by the diffraction of the exposure such that the exposure is spread outside the transparent areas.

There has been an ongoing need to increase the density of features contained in semiconductor devices, by making the features smaller and/or reducing the amount of space between features. Advances in feature density have required that reticles include correspondingly smaller and/or more densely packed features, and as a result, reticle layouts have become increasingly complex.

The extent to which the size of features printed by photolithographic methods can be reduced, and the extent to which gaps between those features can be reduced, are limited by the resolution limit of the exposure device. The resolution limit of an exposure tool is defined as the minimum feature dimension that the exposure tool can repeatedly expose onto the resist, and is a function of the wavelength of exposure emitted by the stepper, the aperture through which exposure is emitted, the depth of focus and other factors. Thus, reticle design is limited in that the gaps between respective features on the reticle (i.e., transparent regions, opaque regions and/or phase shifted regions) must be large enough for the circuit features to be correctly printed.

The critical dimension (CD) of a circuit pattern is defined as the smallest width of a line in the pattern, or the smallest space between lines in the pattern. The CD thus directly affects the size and density of the design. As the density of features in a pattern is increased, the CD of the design approaches the resolution limit of the stepper. As the CD of a circuit layout approaches the resolution limit of the stepper, the diffraction of exposure causes increasingly significant distortions of the pattern being created.

Due to limitations imposed by the wavelength of light used to transfer the pattern, resolution degrades at the edges of the patterns of the reticle. Such degradation is caused by diffraction of the exposure such that it is spread outside the transparent areas. Phase shift masks (PSMs) have been used to counteract these diffraction effects and to improve the resolution and depth of images projected onto a target (i.e., the resist covered wafer). There are a variety of PSMs. One kind of PSM includes transparent areas through which light passes but is phase shifted, e.g., by 180 degrees relative to transparent areas located adjacent to, but on the opposite side, of opaque areas. Attenuated PSMs utilize partially transmissive regions which pass a portion of the exposure, e.g., about three to eight percent, out of phase with exposure through transparent areas. In PSMs, the images of the phase-shifted and unphase shifted areas interfere, destructively reducing the spread of the image, thereby improving resolution. Phase shift masks can thereby increase image contrast and resolution without reducing wavelength or increasing numerical aperture. These masks can also improve depth of focus and process latitude for a given feature size. Designs of such reticles typically are represented using one or more two-dimensional reticle layouts including appropriate reticle features, e.g., selected from among transparent features, opaque features, phase shifting features and/or phase shifting attenuating features.

There is an ongoing need for techniques for designing phase shift masks which can reliably print more densely packed circuit layouts having smaller circuit features. In addition, there is a need for techniques for generating phase shift masks which can reliably print feature layouts which more closely match desired circuit layouts. Also, there is a need for techniques which can convert a circuit layout into a phase shift mask layout in which a larger percentage of the steps in such conversion can be carried out on a computer. Furthermore, there is an ongoing need for such techniques which can carry out such conversions while expending less computer time and equipment.

SUMMARY OF THE INVENTION

The present invention provides a method for designing reticles which can be used to produce circuit designs having densely packed circuit features, in which the variance between the actual exposure pattern and the desired exposure pattern is reduced. In addition, the present invention provides a method for converting a circuit layout into a phase shift mask layout, in which a larger percentage of the steps in such conversion can be carried out on a computer. Furthermore, the present invention provides techniques which can carry out such conversions while expending less computer time and equipment.

The present invention provides a machine implemented method of producing a mask design, comprising:

(a) inputting a binary mask layout comprising at least one cell and/or at least one hierarchy of cells, a hierarchy of cells being defined as a plurality of cells containing mask features, the plurality of cells being arranged in a cell hierarchy;

(b) examining each cell in the binary mask layout and determining if the cell contains at least one printable shape;

(c) if the examined cell contains at least one printable shape, determining if each printable shape will print desired features in a wafer fabrication process and if so, leaving it alone;

(d) if any printable shape will not print desired features in the wafer fabrication process, placing phase shifters next to the shape so that it will print desired features;

(e) repeating steps (b) through (d) until all cells are examined and altered as necessary; and (f) after completion of steps (a) through (e), using the cells in said hierarchy to produce a reticle.

The reticle produced in step (f) is preferably a phase shift reticle.

In one preferred embodiment, step (d) comprises generating a 180 degree phase shift mask pattern from the shapes of the examined cell.

In a preferred embodiment, further steps are conducted to generate 120 degree and 60 degree phase shapes based on 180 degree shapes which have been generated.

The present invention is further directed to integrated circuits which incorporate one or more components made using any of the reticles according to the present invention, e.g., the reticles of the present invention can be used in making such components.

These and other features and advantages of the invention will become more readily apparent from the following detailed description of preferred embodiments of the present invention which is provided in conjunction with the accompanying drawings. The invention is not limited to the exemplary embodiments described below and it should be recognized that the invention includes all modifications falling within the scope of the attached claims.

BRIEF DESCRIPTION OF THE DRAWINGS

FIGS. 18a–18f are flowcharts for the embodiment depicted in FIGS. 1–15.

DETAILED DESCRIPTION OF PREFERRED EMBODIMENTS OF THE INVENTION

Figure 1:
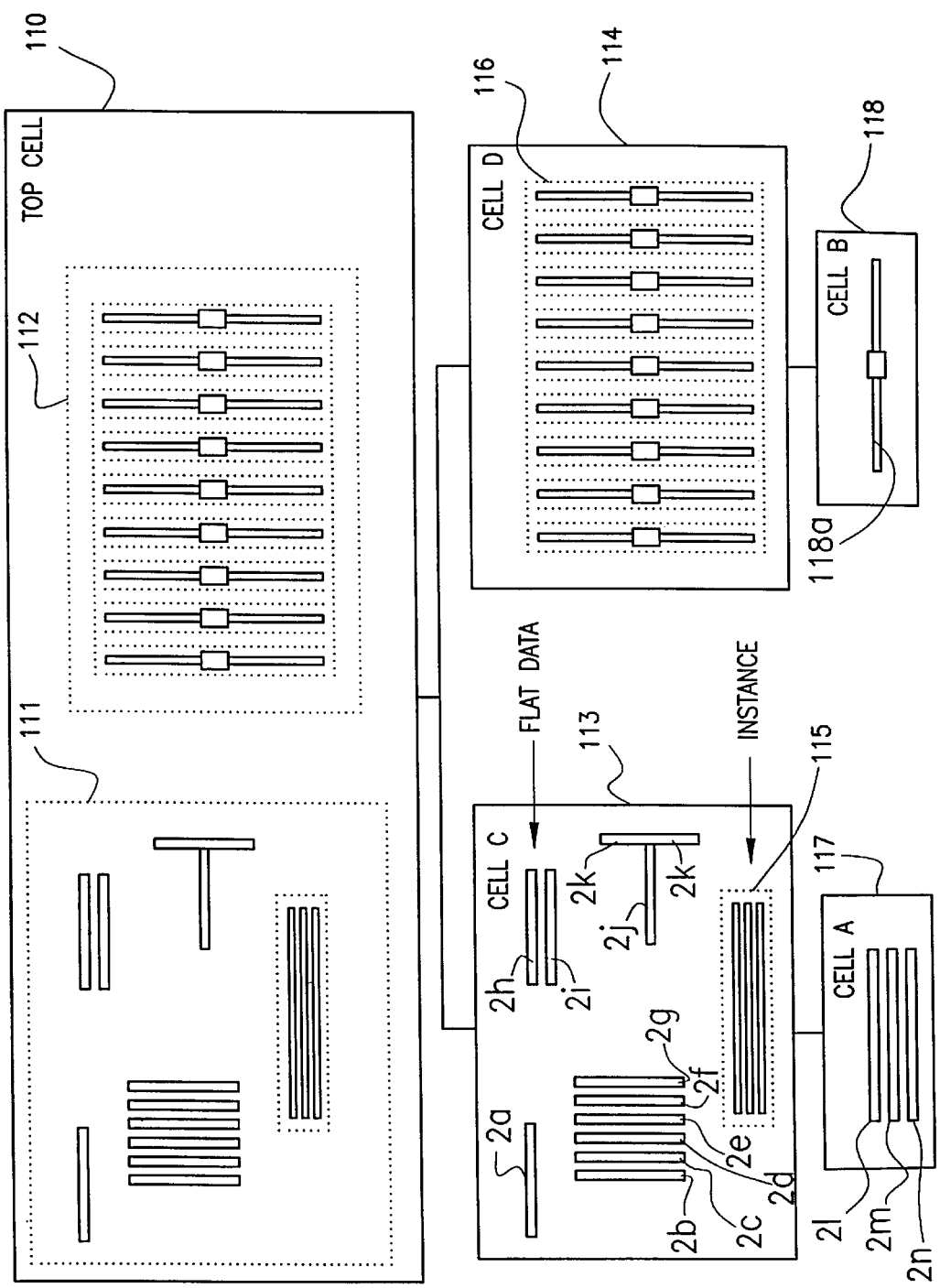
FIGS. 1–15 are schematic views of a reticle layout in various stages of development according to an embodiment of the present invention.

The methods of the present invention make it possible to design reticles which can be used to produce circuit designs having densely packed circuit features, in which the variance between the actual exposure pattern and the desired exposure pattern is reduced. In addition, the present invention provides a method for converting a circuit layout into a phase shift mask layout, in which many of the steps in such conversion are readily and efficiently carried out on a computer.

The present invention provides methods which can readily be applied to generating phase shift mask layouts based on binary mask layouts, in which the binary mask layouts can be in either a flat layout or a hierarchical layout. A flat layout refers to a layout which includes a number of shapes on a background, in which the respective shapes correspond in shape, size and position to the features contained in a circuit layout. The present invention can be used in connection with layouts in which the shapes are opaque and the background is transparent (a clear field binary mask layout) or in which the shapes are transparent and the background is opaque. Clear field layouts are the preferred type according to the present invention.

Complex mask designs can be generated on a computer and stored in a large data file. As the number of features on a chip is increased, the size of these data files is also increased, resulting in files that are so large that working with them may be cumbersome. In a preferred aspect of the present invention, the layout can be divided into a number of smaller units or cells which can be arranged in a hierarchical format. In such hierarchical formats, each cell includes one or more shapes (corresponding to features on the chip) and/or one or more calls to other cells. By arranging the data in such a hierarchy, a library of data (i.e., data for a complete mask design) can be stored more efficiently, thus reducing the overall capacity required to store the necessary data. For example, particular shapes or combinations of shapes which are repeated in a layout can be represented by calls to a single cell containing those features.

A hierarchical layout includes a number of hierarchical levels, each level including one or more cells. Each cell can include one or more shapes and/or one or more "calls" (or "instances"). A call within a cell is an indication that the design contains one or more shapes corresponding to information contained in one or more other cells to which the call refers, such other cells being in another layer.

The present invention provides methods for designing phase shift masks which can be used to counteract diffraction effects and to improve the resolution and depth of images projected onto a target (i.e., the resist covered wafer). Through the use of the present invention, densely packed circuit layouts having smaller features can be reliably imaged.

One example of a phase shift mask which can be designed and/or manufactured according to the present invention (referred to herein as a 180 degree phase shift mask) includes one or more opaque regions, one or more "0 degree phase shift transparent regions" (i.e., region(s) through which some or all of the exposure directed thereto can pass), and one or more "180 degree phase shift transparent regions" (i.e., region(s) through which some or all of the exposure directed thereto can pass, wherein the exposure passing through is about 180 degrees out of phase with the exposure which passes through the 0 degree phase shift transparent region or regions). In such 180 degree phase shift masks, 180 degree phase shift transparent regions are used to destructively interfere with exposure which is spread by diffraction outside the 0 degree phase shift transparent regions. Phase shift masks can thereby increase image contrast and resolution without reducing wavelength or increasing numerical aperture. These masks can also improve depth of focus and process latitude for a given feature size.

It has been observed that there is often a tendency for interfaces between 0 degree phase shift transparent regions and 180 degree phase shift transparent regions to act like opaque lines, and to print (i.e., to produce an image on a resist when exposure is directed through the 180 degree phase shift mask) as such.

Another example of a phase shift mask which can be designed and/or manufactured according to the present invention is a 60–120–180 degree phase shift mask, which includes one or more opaque regions, one or more 0 degree phase shift transparent regions, one or more 180 degree phase shift transparent regions, one or more "60 degree phase shift transparent regions" (i.e., region(s) through which some or all of the exposure directed thereto can pass, wherein the exposure passing through is about 60 degrees out of phase with the exposure which passes through the 0 degree phase shift transparent region or regions), and one or more "120 degree phase shift transparent regions" (i.e., region(s) through which some or all of the exposure directed thereto can pass, wherein the exposure passing through is about 120 degrees out of phase with the exposure which passes through the 0 degree phase shift transparent region or regions). In such 60–120–180 degree phase shift masks, the 120 degree phase shift transparent regions and the 60 degree phase shift transparent regions act as transitional phase shifters, which step the phase shift gradually from 180 degrees to 0 degrees so that lines do not print at the interfaces of regions of different phase transfer degree values.

Those of skill in the art can readily appreciate that 180 degree phase shift masks and 60–120–180 degree phase shift masks are but two examples of types of phase shift masks. The present invention is not limited to any particular type of phase shift mask, and can be applied readily to any type of phase shift mask. For example, any values of phase shift can be imparted to (or designed for) specific regions of a phase shift mask according to the present invention.

Phase shift masks having regions of different phase shift degree values can be made in a variety of different ways. For example, one way to form a phase shift mask which has different regions of differing phase shift values is to form a transparent material having regions of different thicknesses. Regions of different thicknesses can be created by removing material from a specific region or regions of a transparent layer or layers, and/or by adding material to a specific region or regions of a transparent layer or layers. For example, a 60–120–180 degree phase shift mask can be made by forming a layer of a transparent material, such as quartz, having a thickness such that incident light passing through the layer is of the same phase as the light entering the layer, forming a pattern of opaque material on one side of the layer of transparent material, and then etching into the other side of the layer of transparent material to a depth which will shift the phase of incident exposure by 180 degrees (relative to the 0 degree regions, i.e., the regions of the layer which are not etched) in 180 degree phase shift regions, to a depth which will shift the phase of incident exposure by 120 degrees (relative to the 0 degree regions) in 120 degree phase shift regions, and to a depth which will shift the phase of incident exposure by 60 degrees (relative to the 0 degree regions) in 60 degree phase shift regions. Alternatively, the overall thickness of the layer can bring about a phase shift, e.g., of 180 degrees, and the thicknesses of the other phase shift regions can be tailored relative to that phase shift. Alternatively and/or additionally, material can be added to a specific region or regions, such as by adding one or more layers. For example, a first layer of a thickness which brings about a 60 degree phase shift can be added in regions where 60 degree, 120 degree and 180 degree phase shift is desired, a second layer of a thickness which brings about a 60 degree phase shift can be added on top of the first layer in regions where 120 and 180 degree phase shift is desired, and then a third layer can be added on top of the second layer in regions where 180 degree phase shift is desired. Likewise, any combination of added thickness and removed thickness can be used, such that the end result is a design in which each region has a thickness which brings about the specified phase shift for that region, relative to other regions.

Furthermore it is possible to provide different phase shift regions through the use of different materials which bring about different phase shift values per thickness. Also, any combinations of different materials and thicknesses of layers can be used to provide a design which provides the specified phase transfer in each region.

Two-dimensional designs of phase shift masks, which include opaque regions and phase shift regions of at least two different phase shift degree values (e.g., 0 degrees and 180 degrees in the specific example of a 180 degree phase shift mask; or 0 degrees, 60 degrees, 120 degrees and 180 degrees in the specific example of a 60–120–180 degree phase shift mask) are collectively referred to herein as "phase shift layouts" or "phase shift mask layouts".

The present invention also provides methods for designing any of the members of a set of complementary masks, i.e., two or more masks (usually two masks) used in combination. One common example of a set of complementary masks is where two masks are used in tandem—one of the masks being a single-phase shift mask (e.g., having areas of 0 degrees phase shift and areas of 180 degrees phase shift) and the other being a binary mask. Such sets of complementary masks may be useful to avoid printing problems which sometimes occur with multi-phase shift masks, e.g., 60–120–180 degree phase shift masks.

The expression "touching", as used herein, refers to shapes which have edges which abut one another. For example, in FIG. 3, discussed in more detail below, shapes 2b and 3a are "touching", as are shapes 3a and 2c, shapes 2c and 3b, shapes 3b and 2d, shapes 2d and 3c, shapes 3c and 2e, shapes 2e and 3d, shapes 3d and 2f, shapes 2f and 3e, shapes 3e and 2g, shapes 2h and 3f, shapes 3f and 2i, and shapes 2j and 2k.

In one embodiment of a machine implemented method of producing a reticle design, the method comprises inputting an opaque layer layout comprising at least one opaque shape, each opaque shape having at least one dimension which is less than or equal to a user-input threshold dimension; and inserting a phase shift shape along only one edge of each opaque shape, such edge being longer than the threshold dimension.

There is further provided an embodiment of a machine implemented method of producing a reticle design, comprising inputting a layout comprising at least a first shape and a second shape, the first and second shapes each having at least one dimension which is less than or equal to a user-input threshold dimension, the first shape having a first edge which is longer than the threshold dimension, the second shape having a second edge which is longer than the threshold dimension, the first edge and the second edge being spaced from each other by a distance which is less than the threshold dimension; and generating a phase shift layout comprising a phase shift shape between the first edge and the second edge.

A further embodiment of a machine implemented method of producing a reticle design comprises inputting a layout comprising a series of shapes, e.g., opaque shapes, the series comprising at least three shapes, each of the shapes having two long edges which are longer than a user-input threshold dimension and two short edges which are shorter than the threshold dimension, at least one of the long edges of each of the shapes being adjacent to a small-space, each small-space being defined as a space between a pair of long-edges, each pair of long-edges comprising a long-edge of one of the small-shapes and a long-edge of another of the small-shapes, each pair of long-edges being separated from each other by less than the threshold dimension; and generating a phase shift layout in which every other small-space is replaced with a phase shift shape, such that each shape is touching only one phase shift shape.

FIG. 1 is a schematic representation of an example of a hierarchical layout of features which are associated with a binary mask layout. The present invention can produce a layout, optionally hierarchical, for an input binary mask layout, or can work with a previously created hierarchical layout associated with a binary mask layout. Referring to FIG. 1, there is shown a top level including a cell 110 which includes a call 111 (shown surrounded by a first set of dotted lines) and a call 112 (shown surrounded with a second set of dotted lines). FIG. 1 shows an intermediate level including a cell 113 and a cell 114. The cell 113 includes eleven shapes (preferably, e.g., chrome shapes) $2a$–$2k$ and a call 115. The cell 114 includes a call 116. FIG. 1 further shows a bottom level including a cell 117 and a cell 118. The cell 117 includes three shapes $2l$–$2n$. The cell 118 includes one shape $118a$.

The calls 111 and 112 in cell 110 indicate that any shape(s) and/or call(s) in cells 113 and 114 are included in the layout. The call 115 in cell 113 indicates that any shape(s) and/or call(s) in the cell 117 are included in the layout. The call 116 in cell 114 indicates that any shape(s) and/or call(s) in the cell 118 are included in the layout.

For purposes of exemplification, a specific embodiment will now be described in detail (with reference to FIGS. 1–15). According to this embodiment, the features of a binary mask layout are all contained in a single library, i.e., a single computer file directory. The user assigns specific selected values to each of a number of variables. The significance of these selections, and the values assigned to them, will become apparent from the following discussion of an embodiment of the invention. For example, one such variable is the threshold dimension (discussed below). Another variable which is input by the user is the temporary shape width (also discussed below) which is input by a user. Another variable which is input by the user is the border width (discussed below). Other input variables are mentioned below. All such variables are stored for use.

It should be understood that "names" of shapes which are used in the present specification are arbitrary and are used to label shapes, elements, etc., and any other arbitrary names could also be used.

The embodiment shown in FIGS. 1–15 relates to conversion of part of the hierarchical binary layout depicted in FIG. 1 (namely, the shapes in cell 113) to a phase shift mask layout. The other cells in the hierarchical binary layout depicted in FIG. 1 could be handled in a manner which is similar to the treatment of cell 113, as described below. Also, as mentioned above, the present invention can likewise be used to convert a flat binary layout (as opposed to a hierarchical layout) to a phase shift mask layout. Furthermore, it is possible to treat two or more layouts (flat and/or hierarchical) in a single embodiment of the invention. Also, it is possible to treat information contained in more than one library in a single embodiment of the invention (i.e., data contained in two or more computer file directories). In addition, it will be recognized that the steps set forth in the embodiment described below can be conducted in any suitable order or combinations, and methods which include the steps described below in any sequence are all encompassed by the present invention. Furthermore, it should be recognized that the steps described below, and combinations of any of the steps described below, can be accomplished by carrying out the steps in any of a variety of ways, and all such ways of accomplishing the steps described herein are encompassed by the present invention. For example, steps 3–5 below are preferably completed essentially simultaneously. Also, the expressions "copying" and "renaming" should be interpreted to mean merely that a particular shape and its location are accessed and/or stored as data. The present invention is also directed to any one of the steps described herein, alone or in combination with any other step(s), including any other step described herein.

In many instances below, shapes identified by a combination of a name (e.g., "shape", "small shape", "temp shape", or "inside temp") and an alphanumeric identifier (e.g., $2a$, $2b$, etc.) are copied, and the copy is then identified by a combination of a different name and the same alphanumeric identifier. In such instances, the same alphanumeric identifier is used because the original shape and the copy occupy the same space, i.e., they are of the same shape, they are in the same position, and they have the same spatial orientation. For example, in step 2, described below, small shapes $2a$–$2k$ and shapes $2a$–$2k$ occupy the same spaces, respectively; in step 6, described below, inside temp shapes $3a$–$3f$ and temp shapes $3a$–$3f$ occupy the same spaces, respectively; in step 7, described below, dense-line shapes $2c$–$2f$ and small shapes $2c$–$2f$ occupy the same spaces, respectively; in step 9, described below, line-pair-member shapes $2h$ and $2i$ and small shapes $2h$ and $2i$ occupy the same spaces, respectively; etc. The alphanumeric identifier in these instances is the same in order to simplify the drawing Figures. It should be understood, therefore, that in the case of identifier $2c$ in FIG. 5, for example identifier $2c$ refers to shape $2c$, small shape $2c$ and dense-line shape $2c$.

According to this embodiment, there are three routines involved in converting a binary layout to a phase shift mask layout, namely (1) a 180 degree phase generation routine, (2) a phase clean-up routine and (3) a 120 and 60 degree phase generation routine. The embodiment disclosed in FIGS. 1–15 and described herein is thus an embodiment in which a 60–120–180 degree phase shift mask is generated. In this description, the expression "phase", when used during the 180 degree phase generation routine (steps 1–38), designates areas of 180 degree phase; when the expression "phase" is used in the 120 and 60 degree phase generation routine (steps 303–307), it refers to 120 and 60 degree phase, respectively.

FIGS. 18a–18e show a flowchart of the steps involved in the present embodiment, as described below.

Figure 18A:
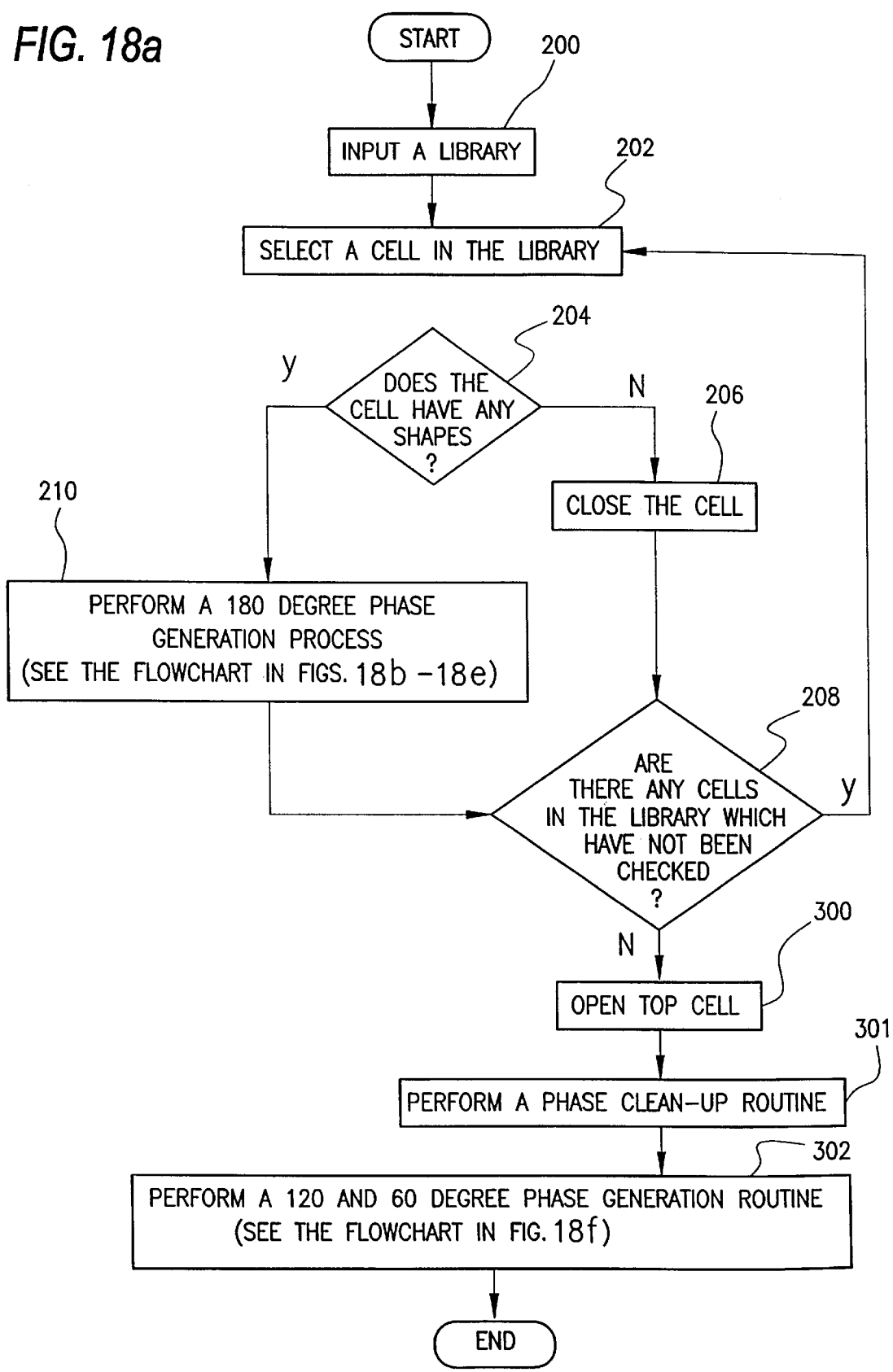
Figure 18C:
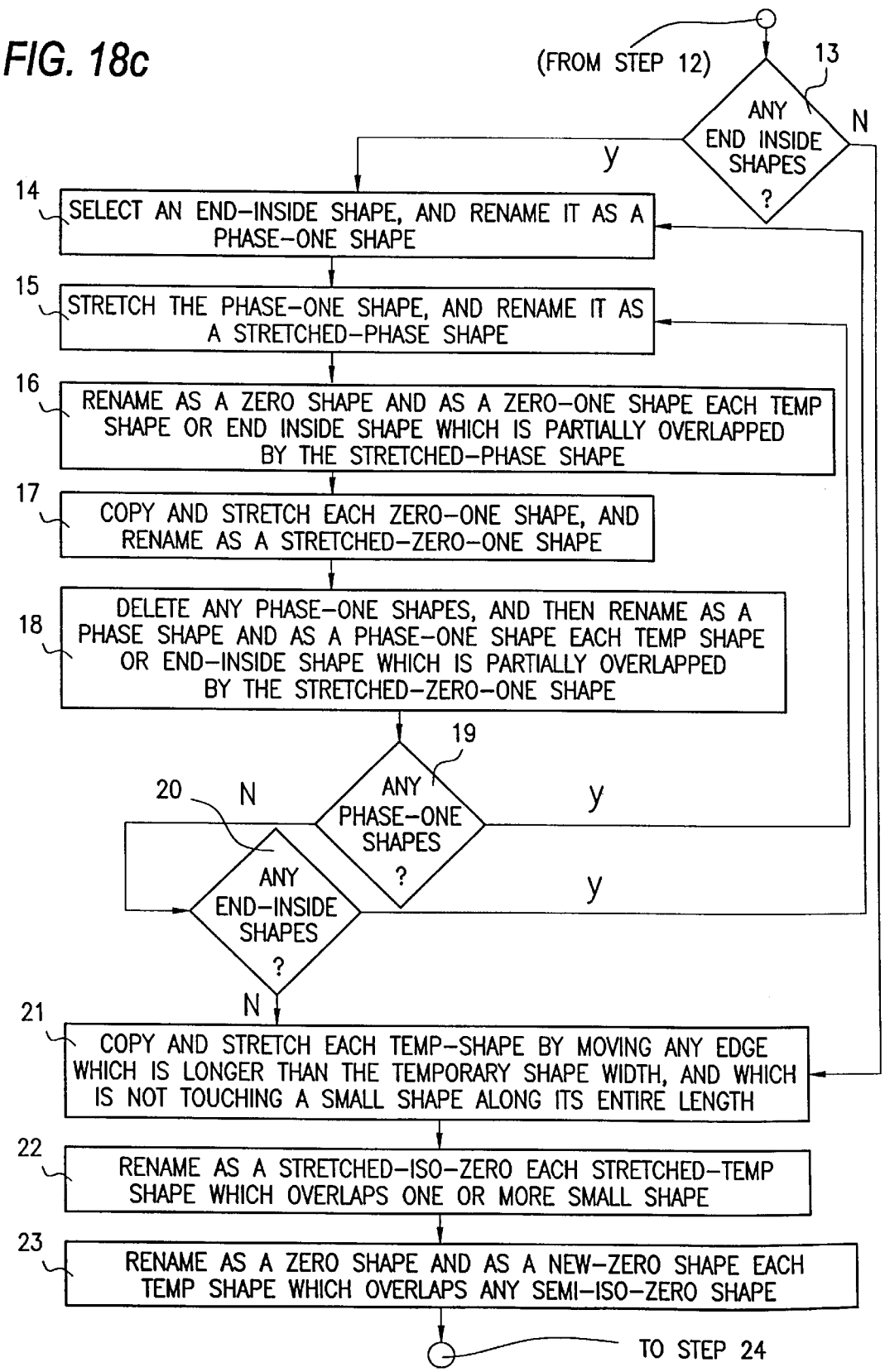
Figure 18D:
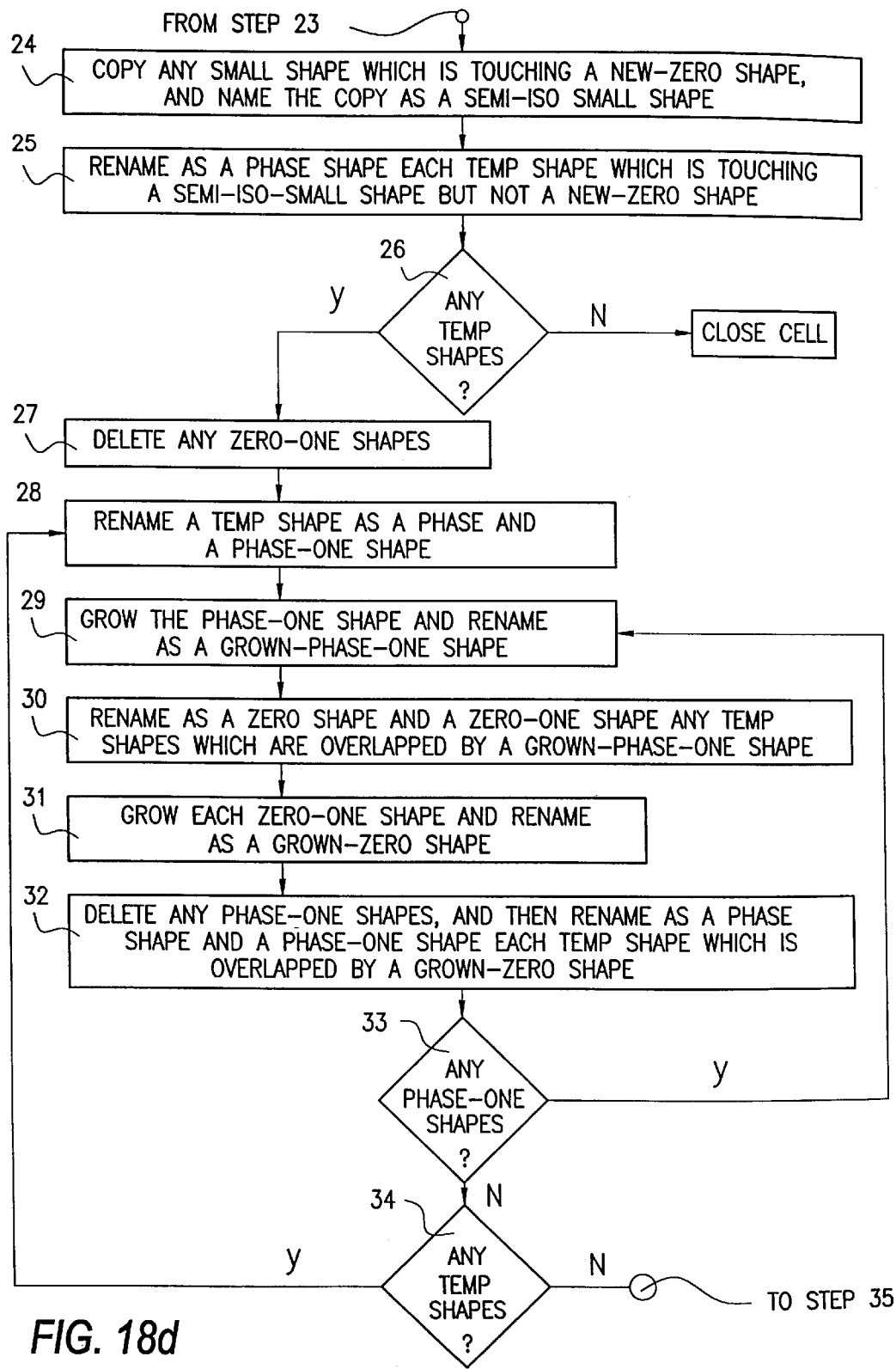
Figure 18E:
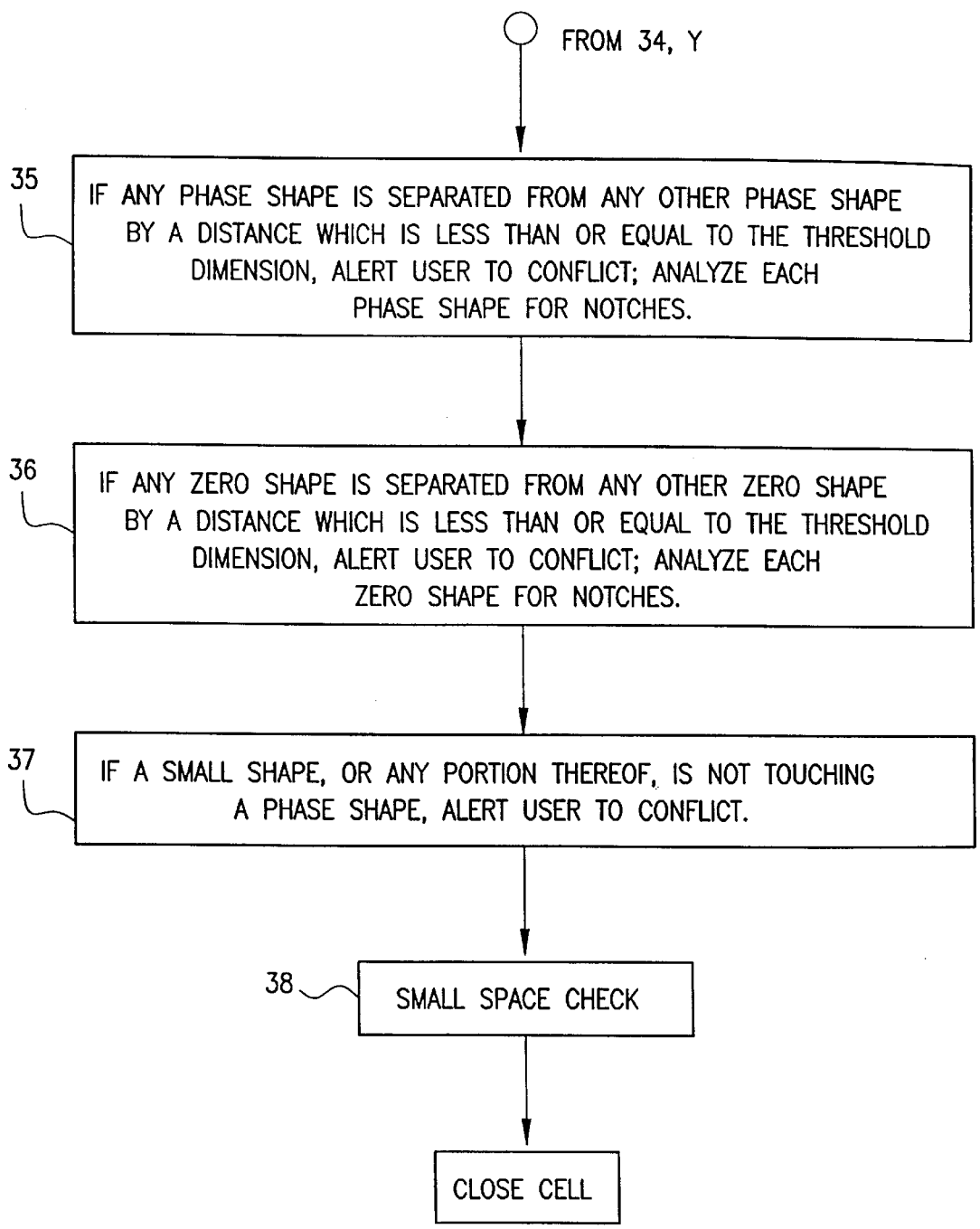

FIG. 18a shows the overall process of the invention. Before the FIG. 18a process begins, a user may previously enter a "threshold dimension", "temporary shape width", and a "border width". These values are stored for use in the process represented by FIGS. 18a–18e. Alternatively, these values can be entered by the user at any other time, optionally with a prompt to alert the user that these values need to be entered.

In step 200 in the present embodiment, a hierarchical cell file is input as a library, and in step 202, a cell in the library is opened and examined. If a flat binary cell is the starting point, steps 200 and 202 will be bypassed, and the cell will be treated beginning at step 204. In step 204, a determination is made as to whether there are any shapes within the cell. If the answer in step 204 is no, the cell is closed in step 206 and a determination is made in step 208, as to whether there are any remaining unopened/checked cells in the library. If the answer in step 208 is yes, the process flow proceeds back to step 202.

If in step 204, the answer is yes, that is, there are shapes in an opened cell, the process proceeds to step 210 where a 180 degree phase generation process (FIGS. 18b–18e) (described in detail below) is performed. After this step, the process proceeds to step 208 where a determination is made as to whether there are any more unopened/checked cells. As noted, if the answer in step 208 is yes, the process proceeds back to step 202. If the answer in step 208 is no, the process proceeds to step 300, where the top cell is opened, and then to step 301, where a phase clean-up routine (described below) is performed. Once the phase clean-up routine is completed, the results are used to perform a 120 degree and 60 degree phase generation routine in step 302 (shown in FIG. 18e as steps 303–307), following which the process flow is terminated. When the process is terminated after step 307, a phase-shift mask design has been created which is capable of creating the features present in the original binary mask layout, from which the hierarchical cell library, input in step 200, was derived.

According to the 180 degree phase generation routine of this embodiment, one by one, each of the cells in the layout is opened, analyzed and optionally modified according to the rules described below. The order in which the cells are is analyzed and/or modified according to the 180 degree phase generation routine can be any desired order.

The shapes are preferably substantially rectangular, however, the present invention is directed to treatment of layouts including shapes of any type. Where non-rectangular shapes are treated, lines which are "perpendicular" to an "edge" of the shape are perpendicular to that edge, rather than an "opposite" edge. Where an edge is not linear, perpendicular lines are substantially perpendicular to a line segment which includes substantially equal areas of the shape on either side thereof, i.e., it substantially bisects the edge.

Using FIG. 1 as an example of cells contained within a library which can be input in step 200, when cell 110 is analyzed at step 204, it will be found that no shapes are present, only calls to other cells are present, and so cell 110 will be closed without making any modifications. When cell 113 is analyzed at step 204, it will be found that shapes 2a–2k are present, and the process proceeds to step 210. When cell 114 is analyzed at step 204, it will be found that no shapes are present, and so cell 114 will be closed without making any modifications. When cell 117 is analyzed at step 20 it will be found that shapes 2l–2n are present, and so the process will proceed to step 210. When cell 118 is analyzed at step 204, it will be found that shape 118a is present, and so the process will proceed to step 210.

The process steps executed at step 210 in FIG. 18a will now be described with reference to FIGS. 18b–18e. At step 2 (FIG. 18b), each shape of a cell is checked to determine whether any dimension of the shape, i.e., the distance from a point on one edge of the (two-dimensional) shape to a point on an opposite edge of the shape, is less than or equal to a threshold dimension (which was input by the user, as discussed above, or previously stored). If the shape has a dimension which is less than or equal to the threshold dimension, the shape is copied and the copy is named as a "small" shape.

Figure 2:
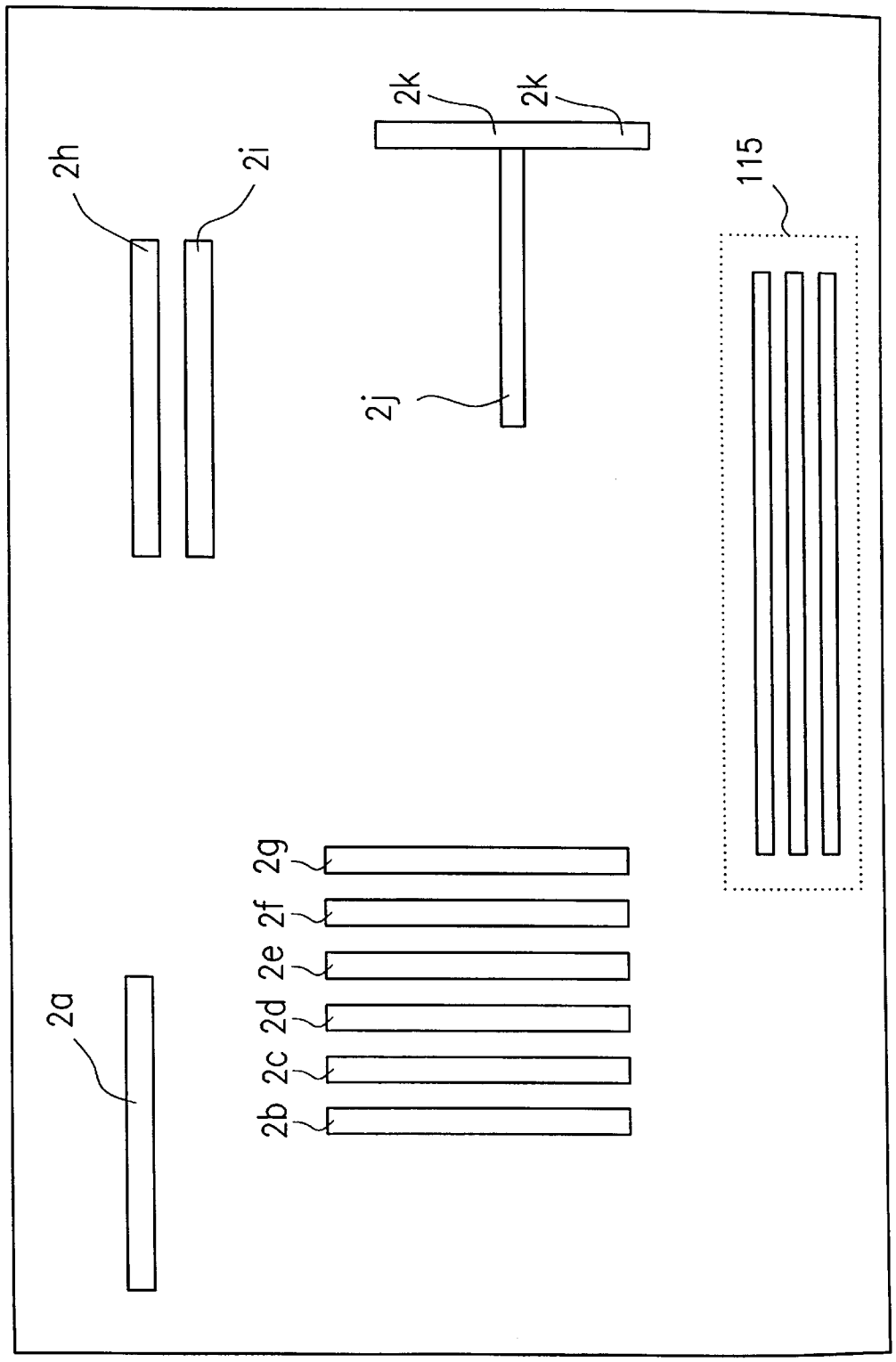

When step 2 is performed on cell 113 (FIG. 1), shapes 2a–2k will be copied and the copies will be named small shapes 2a–2k (see FIG. 2).

In step 3, one by one, each small shape (if any) is analyzed to determine whether at least one dimension of the space between an edge of the small shape being analyzed and an edge of any other shape is less than or equal to the threshold dimension. If so, and if the space has not already been renamed as a "temp" shape, the space is renamed as a "temp" shape. Each such space is defined by lines drawn along the respective edges of the shapes and connecting line segments drawn between the respective edges of the shapes, such connecting line segments being those which result in the area of the space being maximized.

Figure 3:
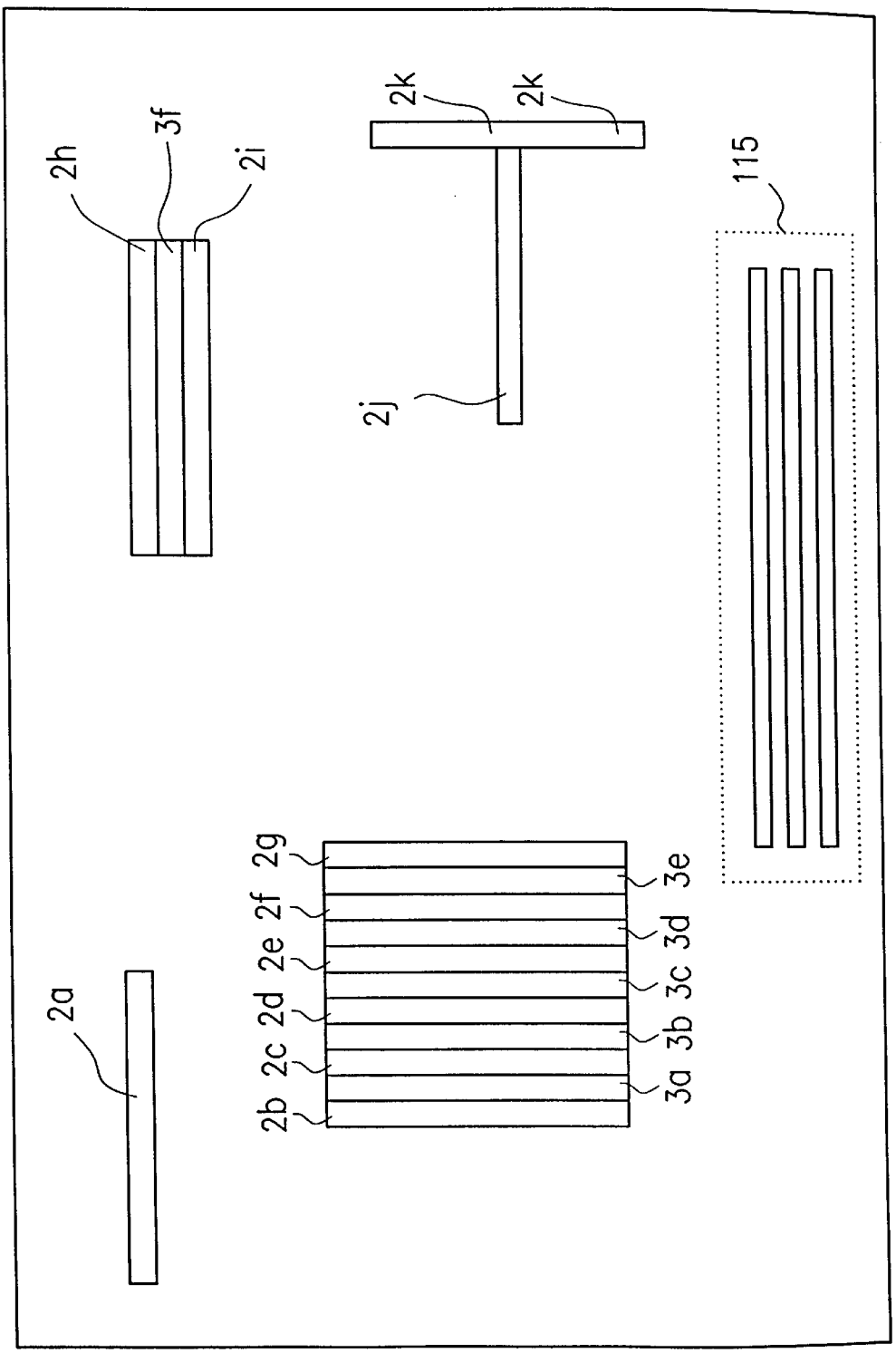

When step 3 is performed on cell 113, temp shapes 3a–3f will be generated (see FIG. 3).

Then, in step 4, a temp shape is inserted along each edge of each small shape (if any), except for those edges which are touching a temp shape which has already been inserted in step (3) above. Each of these temp shapes is defined by stretching an edge of the small shape away from the opposite edge of the small shape in a direction which is perpendicular to the edge of the small shape. Such movement is for a distance which is equal to the previously entered or stored "temporary shape width". In addition, a temp shape is inserted in each space between edges of any two shapes in the cell which are spaced from each other by a distance which is less than or equal to the threshold dimension, if a temp shape is not already located in such space.

Figure 4:
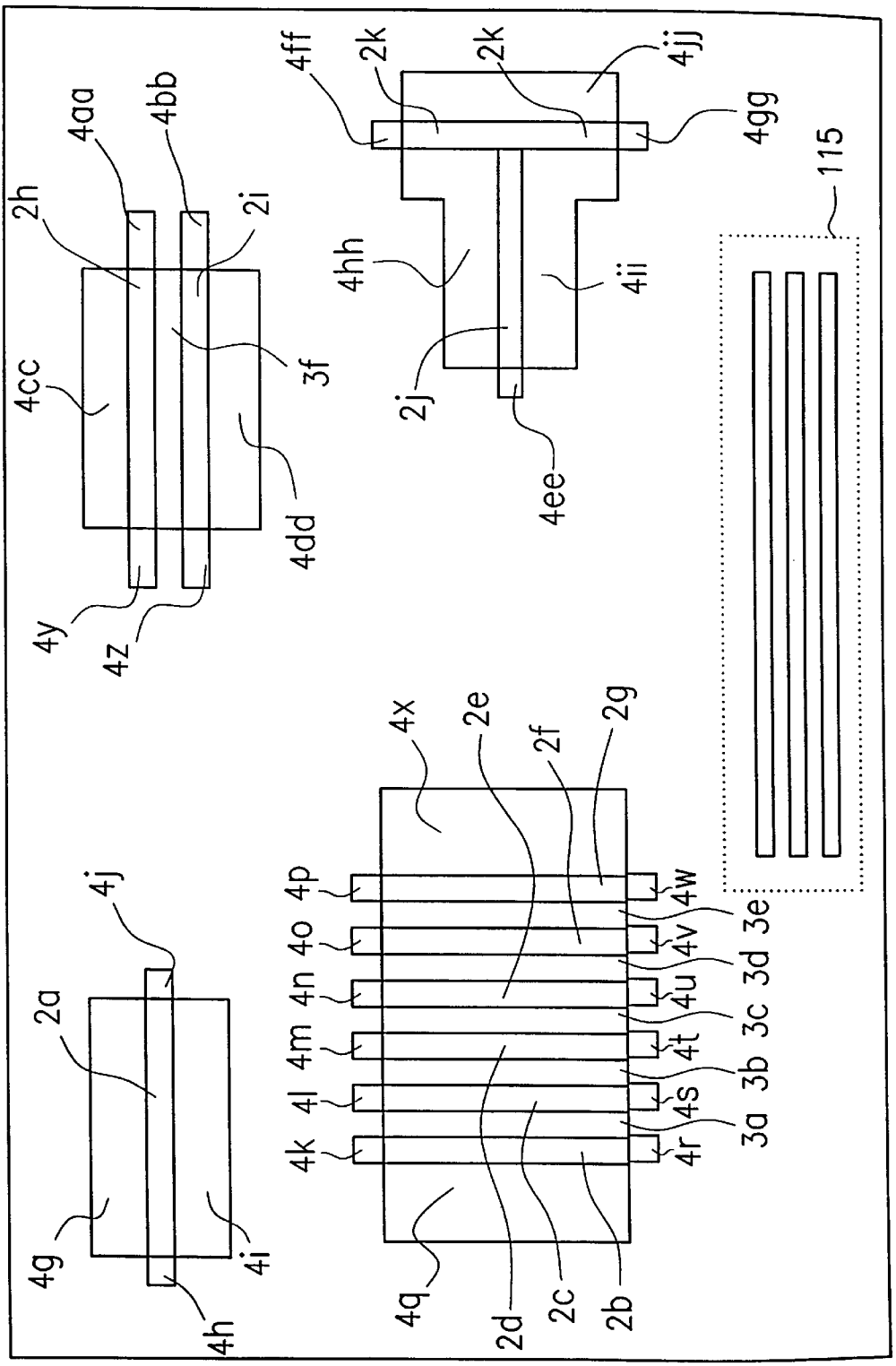

When step 4 is performed on cell 113, temp-shapes 4g, 4h, 4i, 4j, 4k, 4l, 4m, 4n, 4o, 4p, 4q, 4r, 4s, 4t, 4u, 4v, 4w, 4x, 4y, 4z, 4aa, 4bb, 4cc, 4dd, 4ee, 4ff, 4gg, 4hh, 4ii and 4jj will be generated (see FIG. 4).

In step 5, the respective area of each temp shape (if any) generated in step 4 is calculated. Each temp shape (if any) having an area less than the product of the previously entered and stored threshold dimension and the temporary shape width is eliminated.

Figure 5:
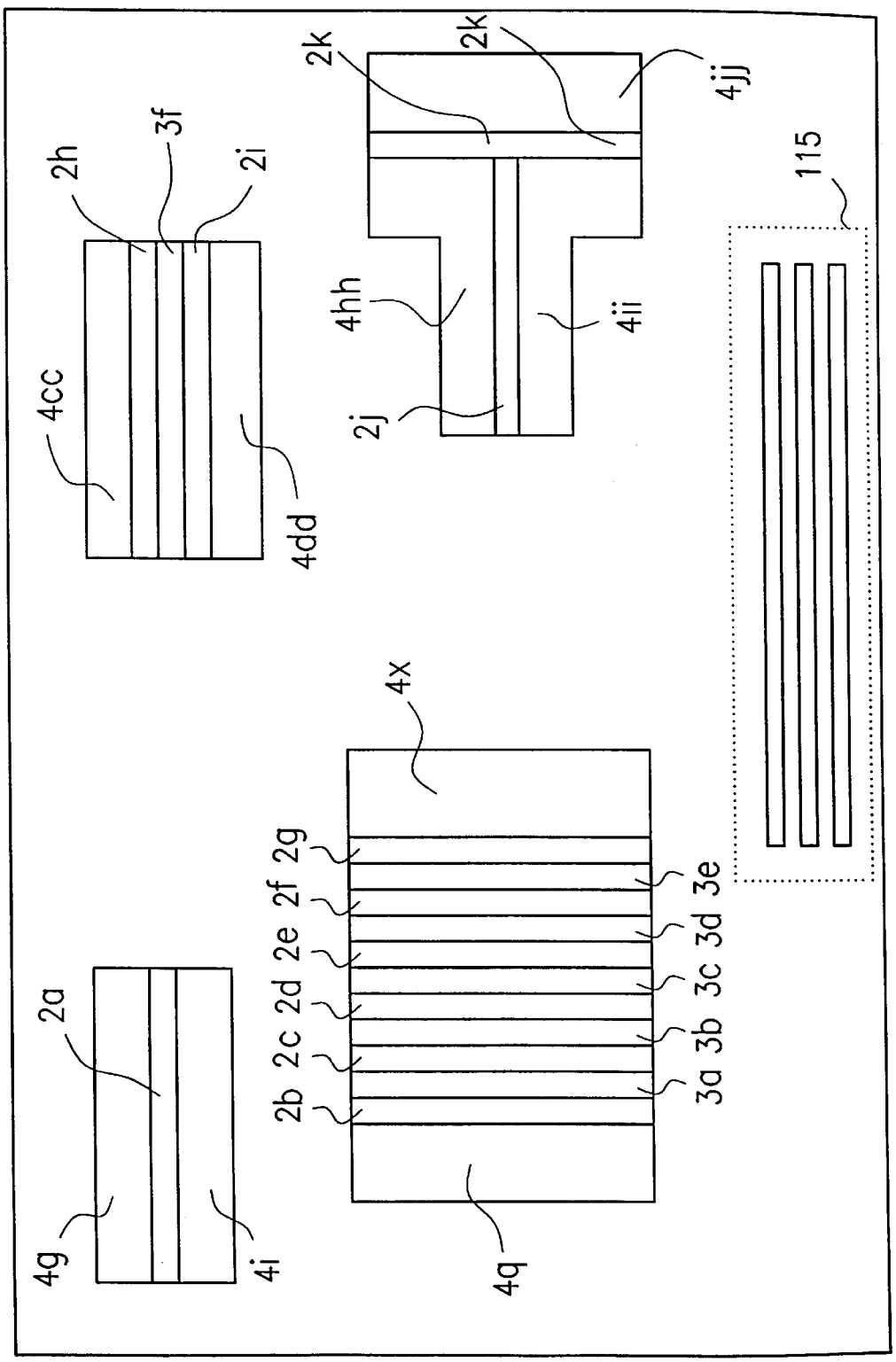

When step 5 is performed on cell 113, temp shapes 4h, 4j, 4k, 4l, 4m, 4n, 40, 4p, 4r, 4s, 4t, 4u, 4v, 4w, 4y, 4z, 4aa, 4bb, 4ee, 4ff and 4gg will be eliminated (see FIG. 5).

In step 6, each temp shape (if any) is analyzed to determine whether it touches two or more small shapes. Each temp shape (if any) which touches two or more small shapes is copied, and the copy is named as an "inside-temp" shape.

When step 6 is performed on cell 113, temp shapes 3a, 3b, 3c, 3d, 3e and 3f will be copied, and the copies will be named inside-temp shapes 3a, 3b, 3c, 3d, 3e and 3f.

In step 7, each small shape (if any) is analyzed to determine whether it touches two or more inside-temp shapes. Each small shape (if any) which touches two or more inside-temp shapes is copied, and the copy is named as a "dense-line" shape.

When step 7 is performed on cell 113, small shapes 2c, 2d, 2e and 2f will be copied and the copies will be named dense-line shapes 2c, 2d, 2e and 2f.

In step 8, each inside-temp shape (if any) is analyzed to determine whether it does not touch any dense-line shapes. Each inside-temp shape (if any) which does not touch any dense-line shapes is renamed as a "phase" shape. Then, each temp shape is analyzed to determine whether it is overlapped by a phase shape. Each temp shape which is overlapped by a phase shape is deleted.

When step 8 is performed on cell 113, it will be found that inside-temp 3f does not touch any dense-line-shapes, and so inside-temp 3f will be renamed phase shape 3f. Then, it will be found that temp shape 3f is overlapped by phase shape 3f, and so temp shape 3f is deleted.

In step 9, each small shape (if any) is analyzed to determine whether it touches a phase shape. Each small shape (if any) which is touching a phase shape is copied, and the copy is named as a "line-pair-member" shape.

When step 9 is performed on cell 113, small shapes 2h and 2i will be copied and named line-pair-member shapes 2h and 2i.

In step 10, each temp shape (if any) is analyzed to determine whether it touches a line-pair-member shape. Any temp shape which is touching a line-pair-member shape is renamed as a zero shape.

When step 10 is performed on cell 113, it will be found that temp shapes 4cc and 4dd are touching line-pair-member shapes 2h and 2l, and so temp shapes 4cc and 4dd will be renamed zero shapes 10cc and 10dd.

In step 11, each small shape (if any) is analyzed to determine whether it touches one (and only one) inside-temp shape. Any small shape which touches only one inside-temp shape is copied, and the copy is named as an "end" shape.

When step 11 is performed on cell 113, small shapes 2b and 2g will be copied, and the copies will be named end shapes 2b and 2g.

In step 12, each inside-temp shape (if any) is analyzed to determine whether it touches an end shape. Any inside-temp shape which touches an end shape is renamed as an "end-inside" shape.

When step 12 is performed on cell 113, inside-temp shapes 3a and 3e will be renamed end-inside shapes 3a and 3e.

In step 13, a check is made to determine if there are any end-inside shapes. If there are any end-inside shapes, a jump is made to step 14. If there are no endinside shapes, a jump is made to step 21, below.

When step 13 is performed on cell 113, it will be found that end-inside 3a and end-inside 3e exist, and so a jump will be made to step 14.

In step 14, an end-inside shape is selected, and is named as a "phase-one" shape.

When step 14 is performed on cell 113, either end-inside shape 3a or endinside shape 3e will be selected and will be renamed as a phase-one shape. In the present embodiment, end-inside shape 3a is selected, and is renamed phase-one shape 3a.

In step 15, the phase-one shape is stretched by moving each edge of the phase-one shape which touches a small shape, and is renamed as a "stretched-phase" shape. This movement is in a direction which is perpendicular to the opposite edge of the phase-one shape, and is of a distance which is equal to the threshold dimension plus the border width. As described above, the border width is previously input by the user and stored. Suitable values for the border width may be in the range of less than ¼ micron, e.g., about 0.05, 0.10 or 0.15 micron. Alternatively, the border width can be defined relative to the critical dimension, i.e., the width of a small-shape, e.g., one tenth of the critical dimension. As a result of this stretching, the phase-one shape becomes a "stretched-phase" shape.

Figure 6:
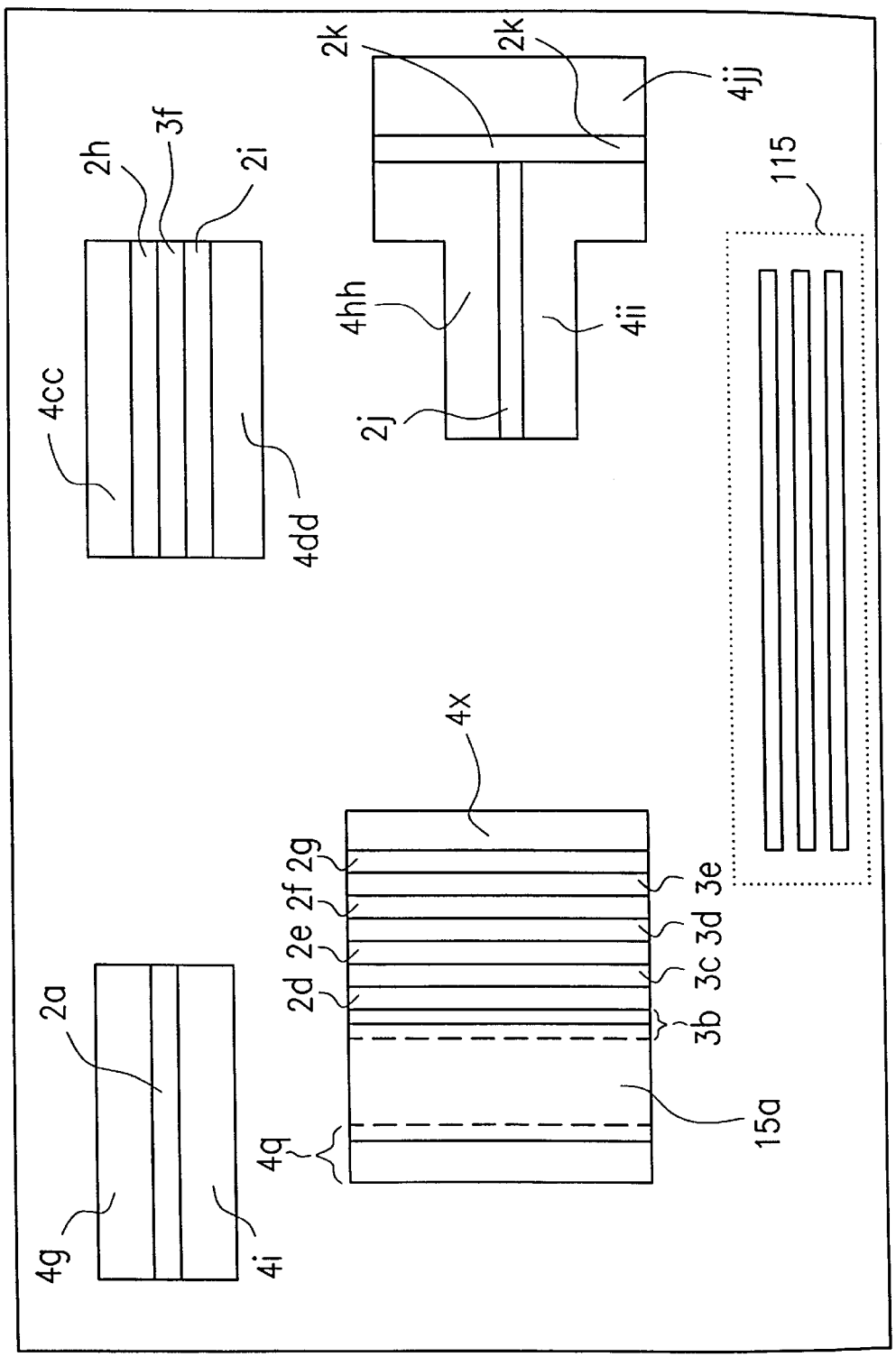

When step 15 is performed on the phase-one shape 3a in the present embodiment, phase-one shape 3a will be stretched to become a stretched-phase shape 15a (see FIG. 6).

In step 16, each zero-one shape (if any) is deleted, and then the stretched-phase shape generated in step 15 is analyzed to determine any temp shapes or end-inside shapes which it partially overlaps. Each temp shape or end-inside shape which is partially overlapped by the stretched-phase shape is renamed as both a "zero" shape and as a "zero-one" shape.

When step 16 is performed on the stretched-phase shape 15a in the present embodiment, it will be found that temp shape 3b and temp shape 4q are partially overlapped by the stretched-phase shape 15a, and so temp shape 3b and temp shape 4q will be renamed as zero shapes 3b and 4q, and as zero-one shapes 3b and 4q.

In step 17, each zero-one shape (if any) is copied and the copy is stretched and named as a stretched-zero-one shape. The zero-one shape is stretched by moving each edge of the zero-one shape which touches a small shape. This movement is in a direction which is perpendicular to the opposite edge of the zero-one shape, and is of a distance which is equal to the threshold dimension plus the border width. As described above, the border width is previously input by the user and stored. Suitable values for the border width may be in the range of less than ¼ micron, e.g., about 0.05, 0.10 or 0.15 micron. Alternatively, the border width can be defined relative to the critical dimension, i.e., the width of a small-shape, e.g., one tenth of the critical dimension.

Figure 7:
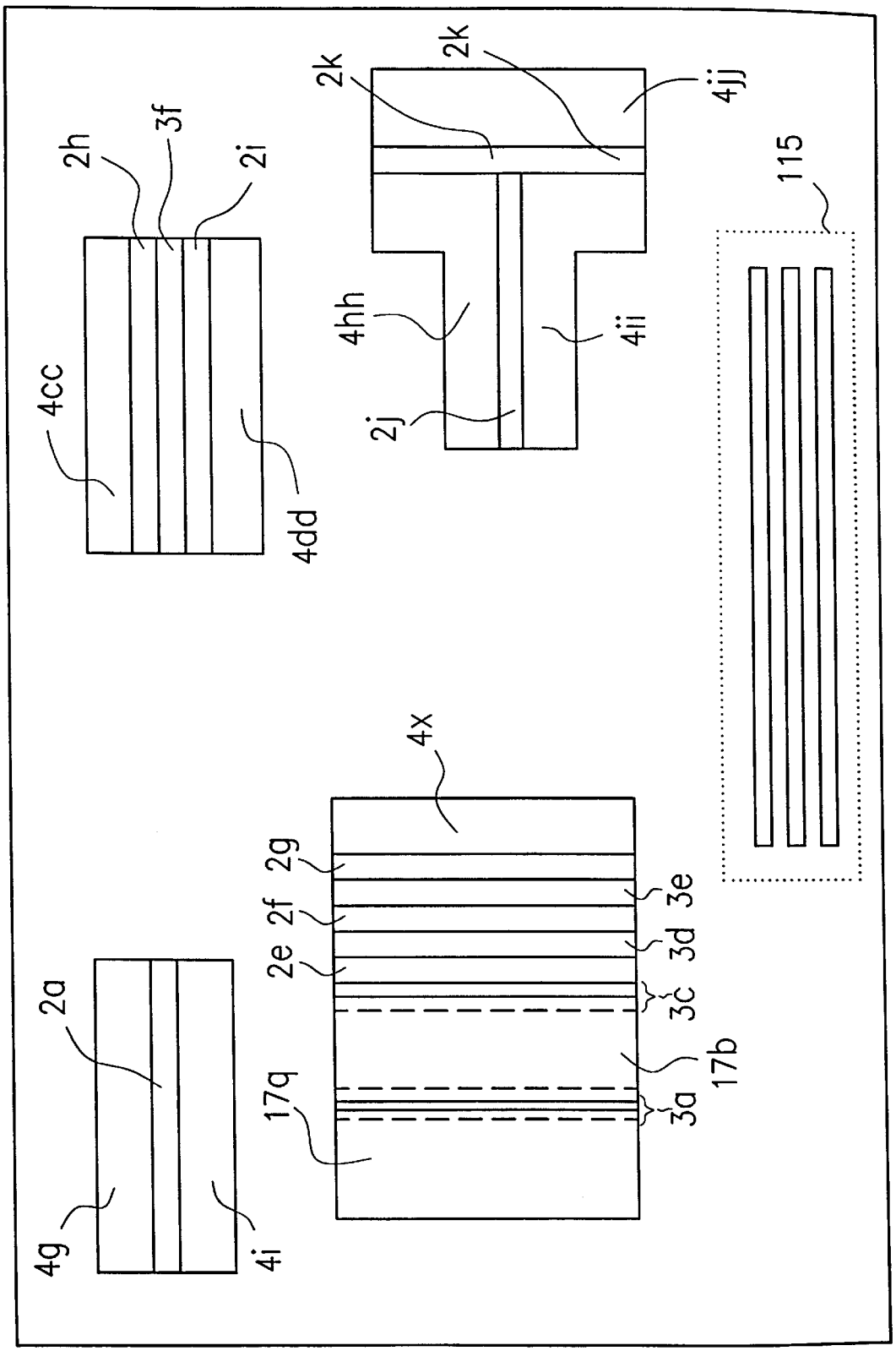

When step 17 is performed in the present embodiment, zero-one shapes 3b and 4q will be copied and stretched to produce stretched-zero-one shapes 17b and 17q and (see FIG. 7).

In step 18, each phase-one shape (if any) is deleted, and then each stretched-zero-one shape generated in step 17 is analyzed to determine any temp shapes or end-inside shapes which it partially overlaps. Each temp shape or endinside shape which is partially overlapped by the stretched-zero-one shape is renamed as both a phase shape and as a phase-one shape.

When step 18 is performed on stretched-zero-one shapes 17q and 17b, it will be found that temp shape 3a is overlapped by stretched zero-one shape 17q, and that temp shapes 3a and 3c are overlapped by stretched-zero-one shape 17b, and so temp shapes 3a and 3c will be renamed phase shapes 3a and 3c and phase-one shapes 3a and 3c.

In step 19, a check is made to determine whether there are any phase-one shapes. If there are no phase-one shapes, a jump is made to step 20. If there are any phase-one shapes, a jump is made back to step 15.

When step 19 is performed for the first time, it will be found that phase-one shapes 3a and 3c exist, and so a jump will be made to step 15.

When step 15 is performed for the second time, phase-one shape 3*a* will be stretched to become a stretched-phase shape 15*a* (having a shape and size as in FIG. 6), and phase-one shape 3*c* will be stretched to become a stretched-phase shape 15*c* (having a shape and size similar to stretched-phase shape 15*a* in FIG. 6).

When step 16 is performed for the second time, zero-one shapes 3*b* and 4*q* will be deleted, and then it will be found that temp shape 3*d* is partially overlapped by the stretched-phase shape 15*c*, and so temp shape 3*d* will be renamed zero shape 3*d* and zero-one shape 3*d*.

Figure 8:
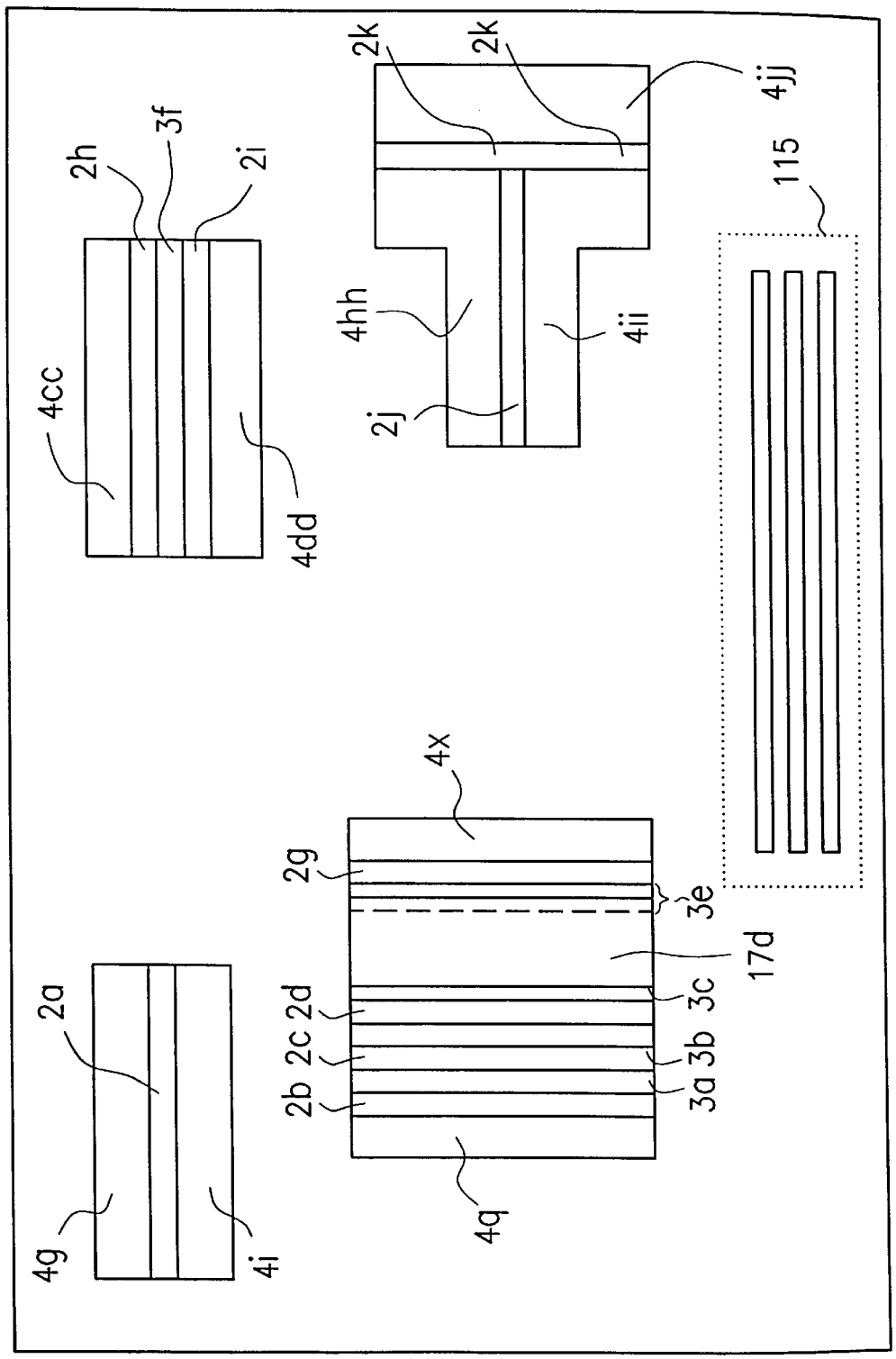

When step 17 is performed for the second time, zero-one shape 3*d* will be copied and stretched to produce a stretched-zero-one shape 17*d* (see FIG. 8).

When step 18 is performed for the second time, phase-one shape 3*e* will be deleted, and then it will be found that temp shape 3*e* and end-inside shape 3*e* are overlapped by stretched zero-one shape 17*d*, and so temp shape 3*e* and end-inside shape 3*e* will be renamed phase shape 3*e* and phase-one shape 3*e*.

When step 19 is performed for the second time, it will be found that phaseone shape 3*e* exists, and so a jump will be made to step 15.

Figure 9:
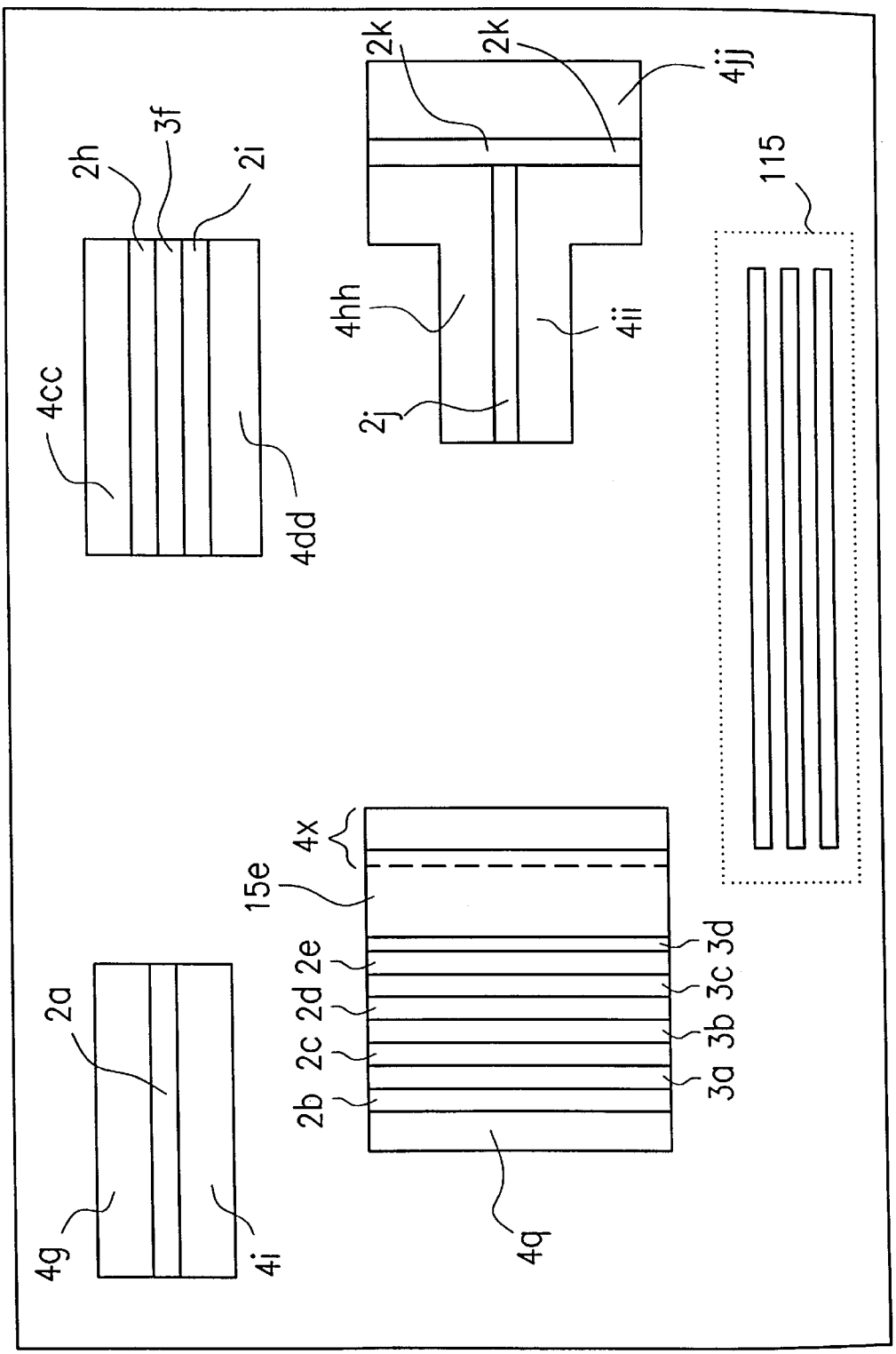

When step 15 is performed for the third time, phase-one shape 3*e* will be stretched to become a stretched-phase shape 15*e* (see FIG. 9).

When step 16 is performed for the third time, zero-one shape 3*d* will be deleted, and then it will be found that temp shape 4*x* is partially overlapped by the stretched-phase shape 15*e*, and so temp shape 4*x* will be renamed zero shape 4*x* and zero-one shape 4*x*.

Figure 10:
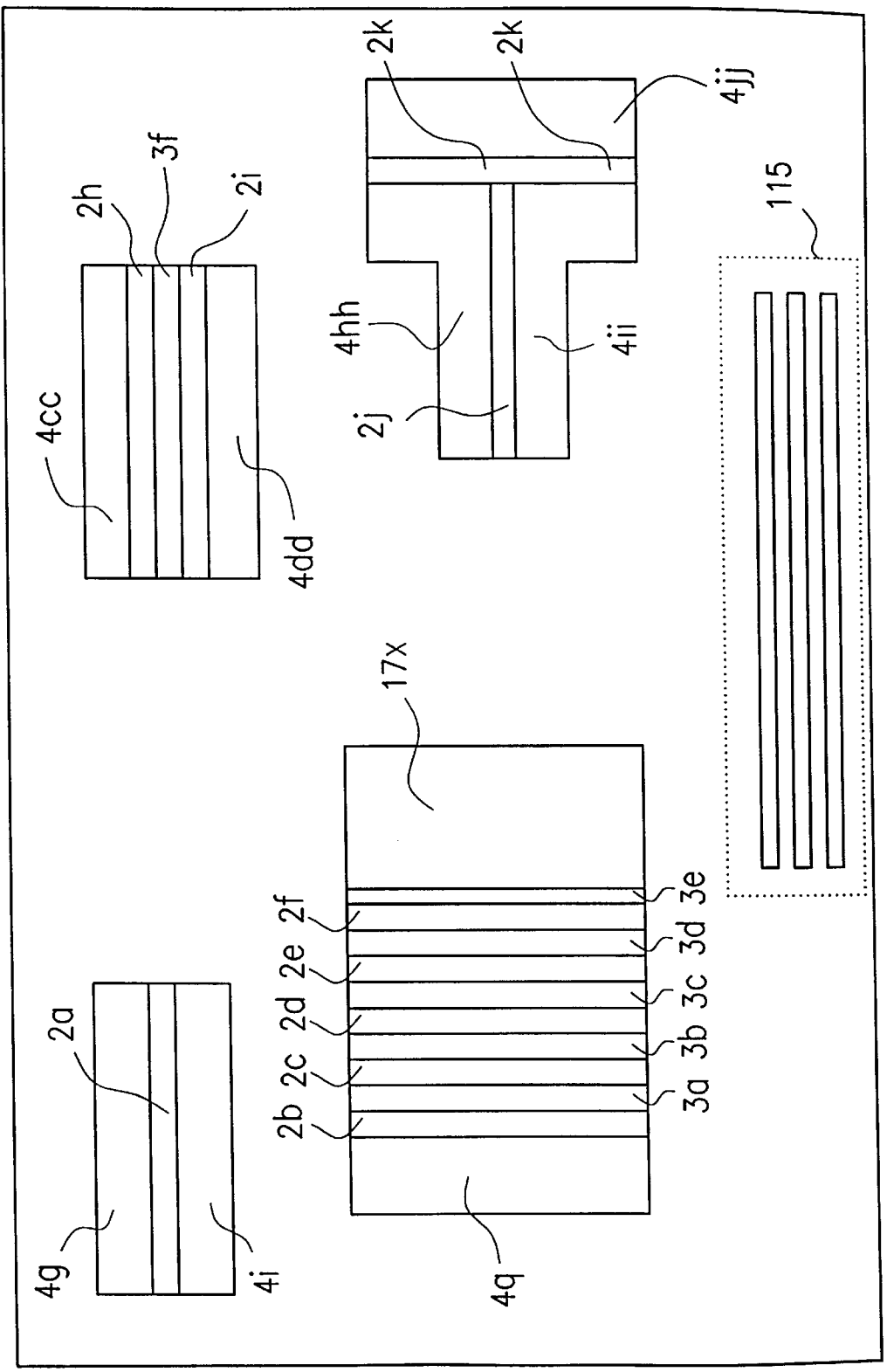

When step 17 is performed for the third time, zero-one shape 4*x* will be copied and stretched to produce a stretched-zero-one shape 17*x* (see FIG. 10).

When step 18 is performed for the third time, it will be found that no temp shape is overlapped by stretched zero-one shape 17*x*.

When step 19 is performed for the third time, it will be found that no phase-one shape exists, and so a jump will be made to step 20.

In step 20, a check is made to determine whether any end-inside shapes remain. If any end-inside shapes remain, a jump is made to step 14 and steps 14–19 are repeated until no end-inside shapes remain. If no end-inside shapes remain, a jump is made to step 21.

When step 20 is performed on the present embodiment, it will be found that no end-inside shapes remain, and so a jump will be made to step 21.

In step 21, each remaining temp-shape (if any) is copied, and the copy is stretched by moving any edge which is longer than the temporary shape width, and which is not touching a small-shape along its entire length, to form a stretched-temp shape. This movement is in a direction which is perpendicular to the opposite edge of the temp-shape, and is of a distance which, in the present embodiment, is equal to four times the threshold dimension.

Figure 11:
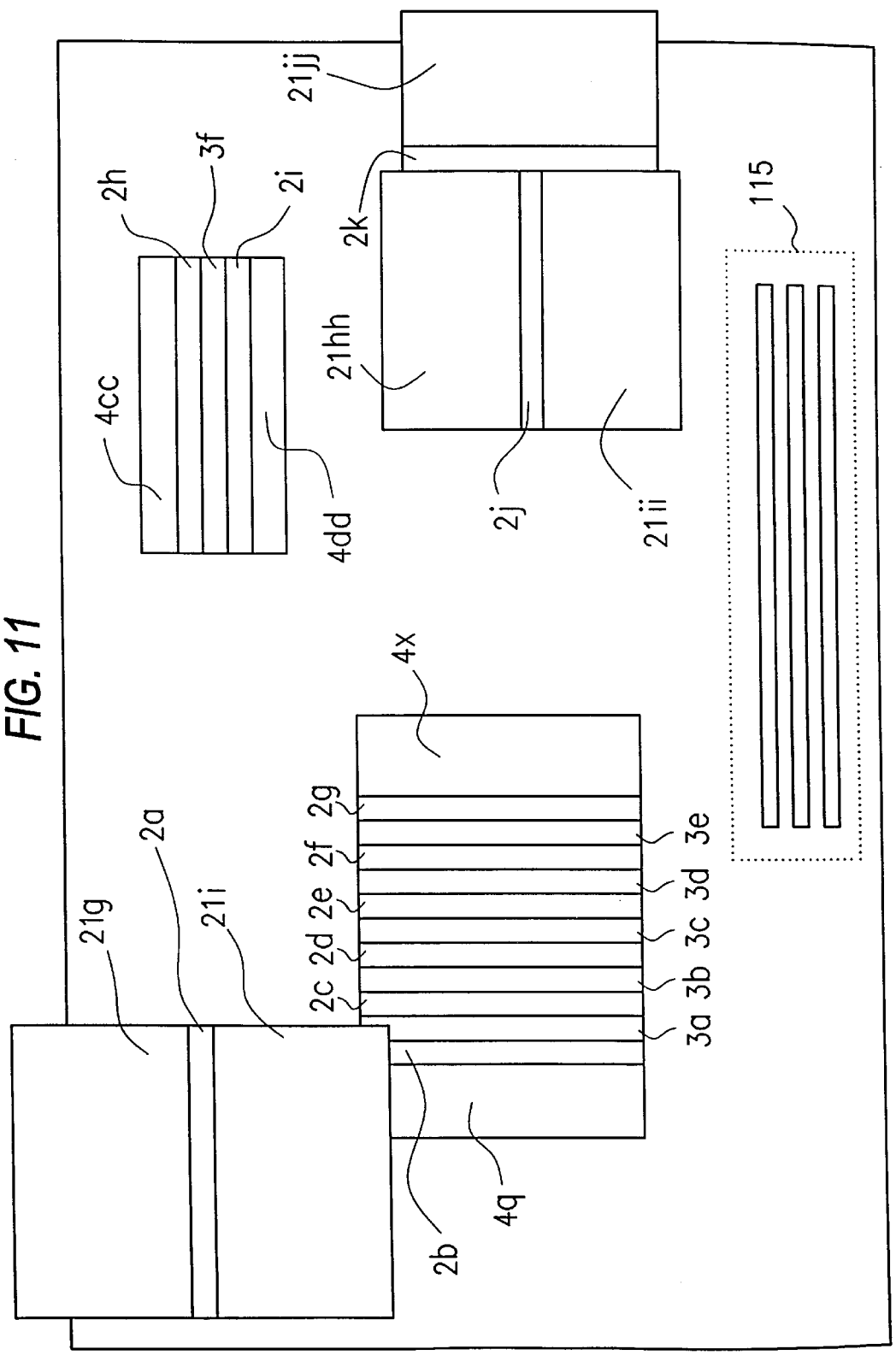

When step 21 is performed on the present embodiment, temp-shapes 4*g*, 4*i*, 4*hh*, 4*ii* and 4*jj* will be copied and stretched to become stretched-temp shapes 21*g*, 21*i*, 21*hh*, 21*ii* and 21*jj* (see FIG. 11).

In step 22, one by one, each stretched-temp shape (if any) is analyzed to determine whether it overlaps one or more small shape. Any stretched-temp shape which overlaps one or more small shape is renamed as a "stretched-iso-zero" shape.

When step 22 is performed on the present embodiment, it will be found that stretched-temp shape 21*i* overlaps small shape 2*b*, and therefore stretched-temp shape 21*i* will be renamed as a semi-iso-zero shape 21*i*.

In step 23, one by one, each temp shape (if any) is analyzed to determine whether it overlaps any semi-iso-zero shape. Any temp shape which overlaps any semi-iso-zero shape is renamed as both a zero shape and as a new-zero shape.

When step 23 is performed on the present embodiment, it will be found that temp shape 4*i* overlaps semi-iso-zero shape 21*i*, and so temp shape 4*i* will be renamed zero shape 4*i* and new-zero shape 4*i*.

In step 24, each small shape is checked to determine whether it touches a new-zero shape. Any small shape which is touching a new-zero shape is copied, and the copy is named as a semi-iso-small shape.

When step 24 is performed on the present embodiment, it will be found that small shape 2*a* is touching new-zero shape 4*i*, and so small shape 2*a* is copied, and the copy is named semi-iso-small shape 2*a*.

In step 25, each temp shape (if any) is checked to determine whether it touches a semi-iso-small shape but not a new-zero shape. Any temp shape which is touching a semi-iso-small shape but not a new-zero shape is renamed as a phase shape.

When step 25 is performed on the present embodiment, it will be found that temp shape 4*g* is touching semi-iso-small shape 2*i* and is not touching any new-zero, and so temp shape 4*g* will be renamed phase shape 4*g*.

In step 26, a check is made to determine whether there are any remaining temp shapes. If not, the cell being analyzed is closed. If there are one or more remaining temp shapes, a jump is made to step 27.

When step 26 is performed on the present embodiment, it will be found that temp shapes 3*f*, 4*hh*, 4*ii* and 4*jj* remain, and therefore a jump will be made to step 27.

In step 27, any zero-one shapes are deleted.

In the present embodiment, zero-one shape 4*x* will be deleted.

In step 28, one of the remaining temp shape(s) is selected and renamed as a phase shape and a phase-one shape.

In the present embodiment, one of temp shapes 3*f*, 4*hh*, 4*ii* and 4*jj* will be selected and will be renamed as a phase-one shape. In the present embodiment, temp shape 4*hh* is selected, and is renamed phase shape 4*hh* and phase-one shape 4*hh*.

In step 29, the phase-one shape is grown (i.e., the sides are moved by a distance equal to the threshold dimension plus the border width, and connected to points where lines encompassing the sides would intersect) and renamed as a grown-phase-one shape.

Figure 12:
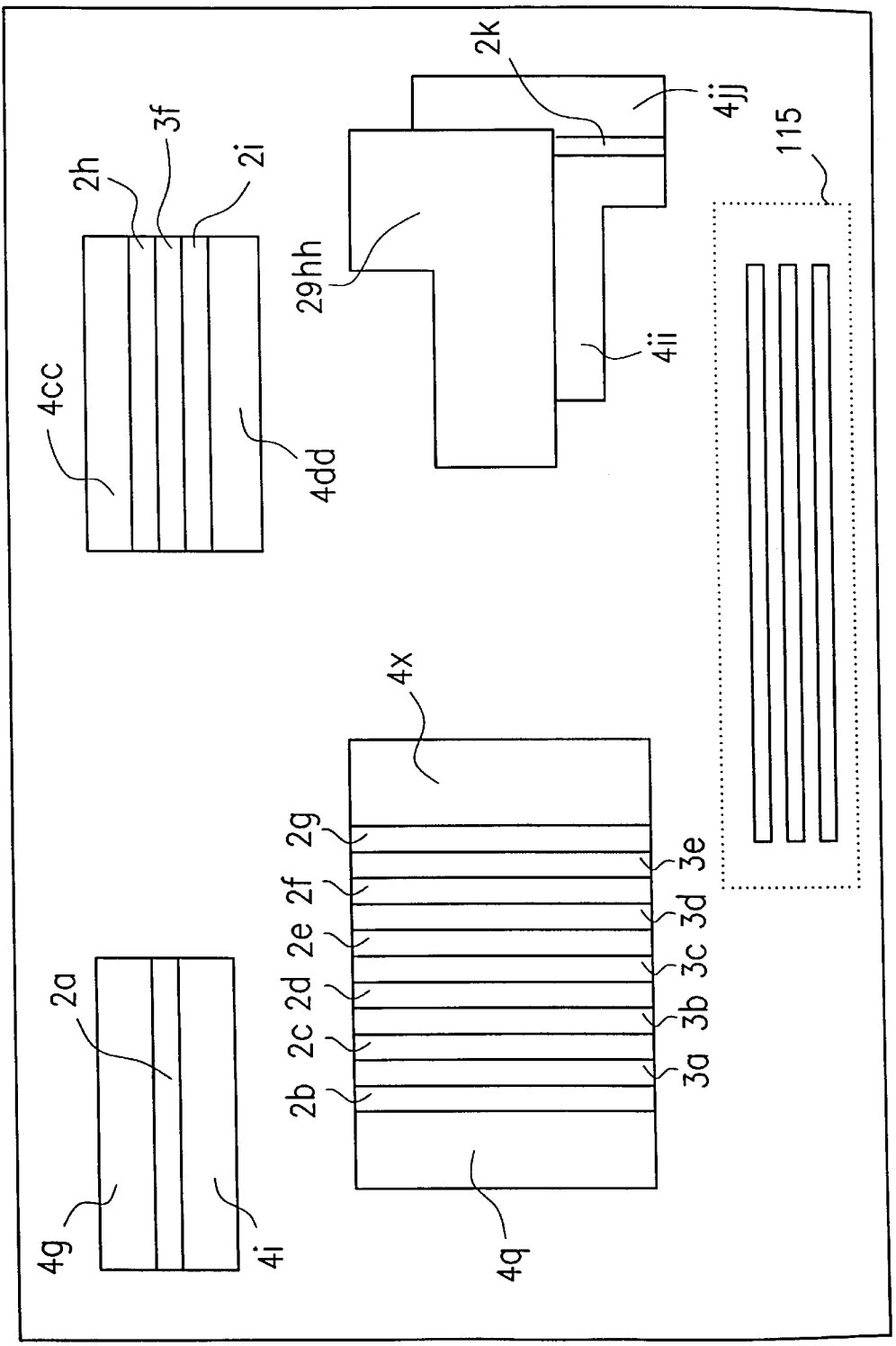

In the present embodiment, phase-one shape 4*hh* will be grown and renamed grown-phase-one shape 29*hh* (see FIG. 12).

In step 30, each grown-phase-one shape (if any) is checked to determine whether it overlaps any temp shapes. Any temp shapes which are overlapped by a grown-phase-one shape are renamed as a zero shape and a zero-one shape.

In the present embodiment, it will be found that temp shapes 4*ii* and 4*jj* are overlapped by grown-phase-one shape 29*hh*, and so temp shapes 4*ii* and 4*jj* will be renamed zero shape 4*ii* and 4*jj*, and zero-one shapes 4*ii* and 4*jj*.

In step 31, each zero-one shape (if any) is grown and renamed as a grown-zero shape.

Figure 13:
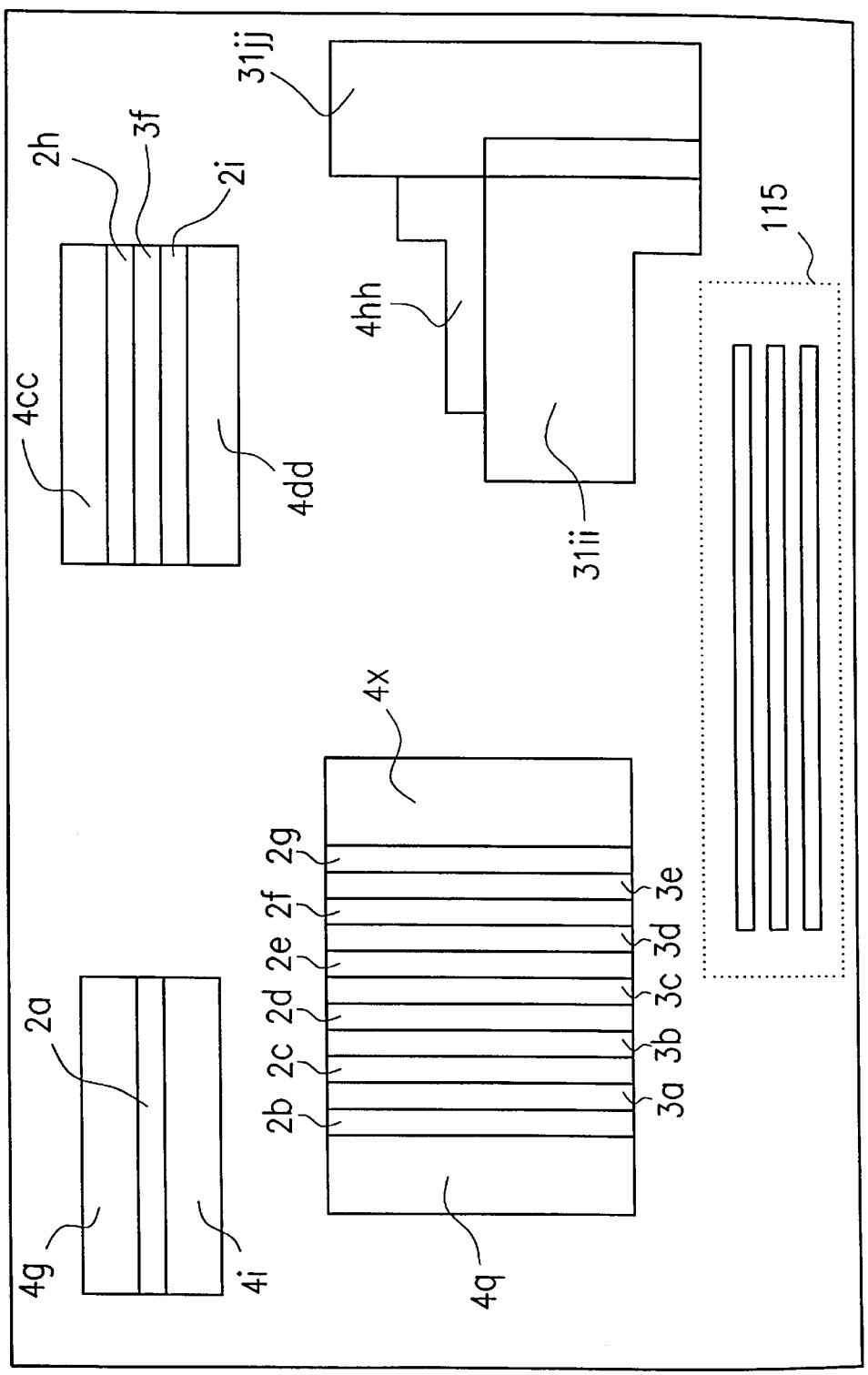

In the present embodiment, zero-one shapes 4*ii* and 4*jj* will be grown and renamed grown-zero shapes 31*ii* and 31*jj* (see FIG. 13).

In step 32, each phase-one shape (if any) is deleted, and then each temp shape (if any remain) is analyzed to determine whether it is overlapped by a grown-zero shape. Any temp shape which is overlapped by a grown-zero shape is renamed as a phase shape and a phase-one shape.

In the present embodiment, phase-one shape 4*hh* will be deleted, and then because no temp shapes remain, no further changes will be made.

In step 33, a check is made to determine whether any phase-one shapes exist. If so, a jump is made to step 28, and steps 28–33 are repeated until there are no more phase-one shapes as determined in step 33. If no phase-one shapes exist in step 33, a jump will be made to step 34.

In the present embodiment, it will be found that no phase-one shapes exist, and so a jump will be made to step 34.

In step 34, a check is made to determine whether any temp shape(s) exist. If so, a jump is made to step 27, and steps 27 through 34 are repeated until there are no temp shapes as detected in step 34. If no temp shapes exist in step 34, a jump is made to step 35.

In the present embodiment, it will be found that no temp shapes exist, and so a jump is made to step 35.

In step 35, each phase shape is checked to determine whether it is separated from any other phase shape by a distance which is less than or equal to the threshold dimension. If any phase shape is separated from any other phase shape by a distance which is less than or equal to the threshold dimension, the user is alerted to the fact that there is a conflict (which preferably includes a visual representation of the phase shapes and/or the space between them) with respect to those phase-shapes, so that the user can make any desired correction. In addition, each phase shape is analyzed for the presence of notches, i.e., areas where two or more portions of a single phase shape are spaced from one another, on opposite sides of a section of a shape, e.g., a chrome shape, by a distance less than the critical dimension. Any such areas are brought to the attention of the user.

When step 35 is performed on the present embodiment, it will be found that no phase shape is separated from any other phase shape by a distance which is less than the threshold dimension, and no notches are present.

In step 36, each zero shape is checked to determine whether it is separated from any other zero shape by a distance which is less than or equal to the threshold dimension. If any zero shape is separated from any other zero shape by a distance which is less than or equal to the threshold dimension, the user is alerted to the fact that there is a conflict (preferably including a visual representation of the zero shapes and/or the space between them) with respect to those zero-phases, so that the user can make any desired correction. In addition, each zero shape is analyzed for the presence of notches, i.e., areas where two or more portions of a single zero shape are spaced from one another, on opposite sides of a section of a shape, e.g., a chrome shape, by a distance which is less than the critical dimension. Any such areas are brought to the attention of the user.

Figure 14:
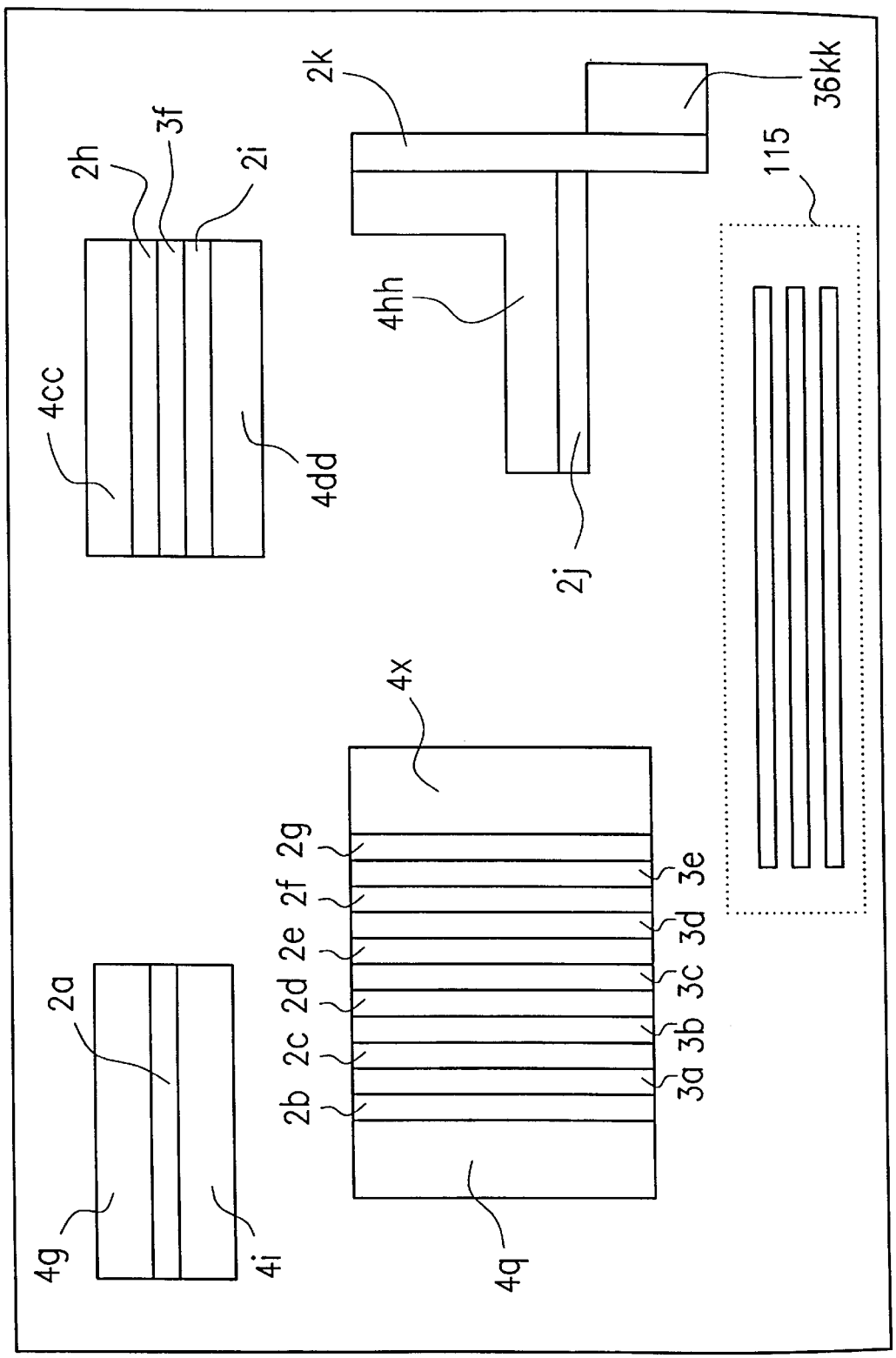

When step 36 is performed on the present embodiment, it will be found that zero-phase shapes on opposite sides of the lower part of small shape 2*k* are spaced from each other by less than the threshold dimension. The user will be alerted to the presence of this conflict area, and appropriate modifications can be made, e.g., manually. One possible modification would be to create a phase shape 36*kk* as depicted in FIG. 14. In addition, it will be found that no notches are present.

In step 37, each small shape is checked to see if it (or any portion of it) is not touching a phase shape. If a small shape, or any portion thereof, is not touching a phase shape, the user is alerted to the fact that there is a conflict (preferably including a visual reprsentation of the small shape, or portion thereof, so that the user can make any desired correction(s).

In step 38, a check is made to determine whether there are any small spaces, or portions thereof, between any two shapes in the cell (i.e., spaces between an edge of one shape and an edge of a second shape, which edges are spaced from each other by a distance which is less than the threshold dimension) which are not filled by a zero shape or a phase shape. If so, the user is alerted to the fact that there is a phase conflict (preferably including a visual representation of the small space, or portion thereof) so that the user can make any desired correction(s).

When all of the cells in the layout have been opened and treated as described above, the top cell is opened (step 300 of FIG. 18*a*) and the phase cleanup routine (step 301 of FIG. 18*a*) is performed. According to the phase clean-up routine, the top cell, which includes everything in the layout, is checked for the presence of any gaps or overlaps between phase shapes, or between a shape (e.g., a chrome shape) and a phase shape, such gaps falling below a threshold dimension or dimensions input by the user. Any such gaps are filled with phase, i.e., the sides of the phase shapes on the opposite sides of such gaps are connected. If a phase shape is overlapping a shape, the portion of the phase shape which is overlapping the shape is deleted.

Figure 18F:
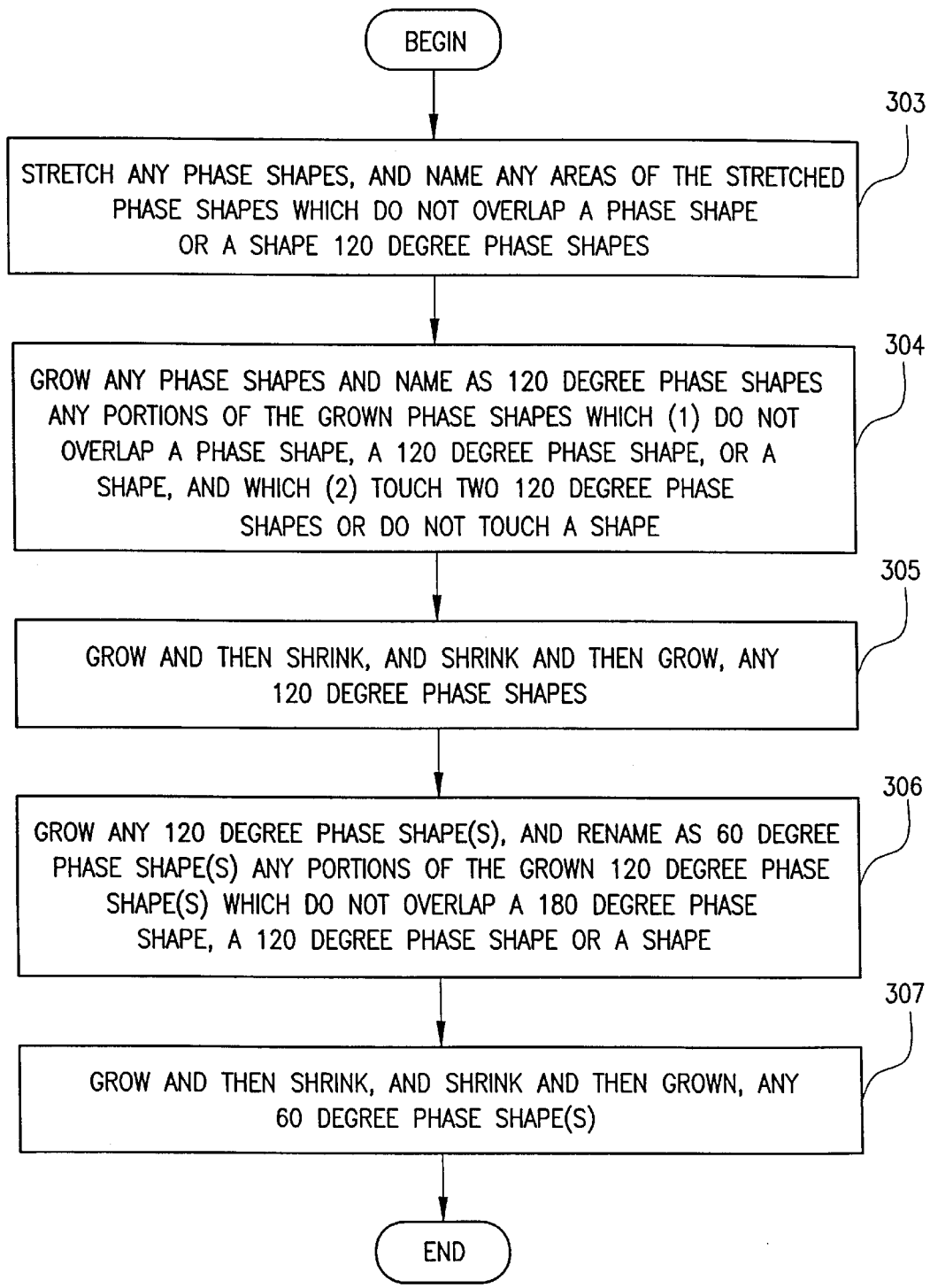

Once the phase clean-up routine of step 301 is completed, the 120 and 60 degree phase generation routine (step 302) begins. The process steps executed at step 302 in FIG. 18*a* will now be described with reference to FIG. 18*f*—step 302 in FIG. 18*a* includes steps 303–307 in FIG. 18*f*.

The top cell remains opened from step 300.

Figure 16A:
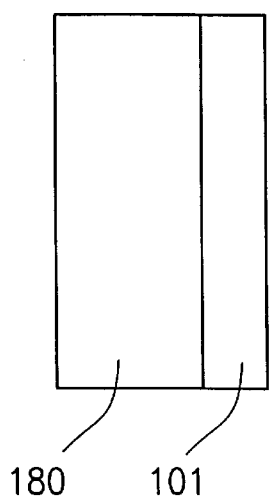
FIGS. 16a–16f are schematic views of reticle layout shapes, and 120 degree phase shapes and 60 degree phase shapes generated around the reticle layout shapes.
Figure 16B:
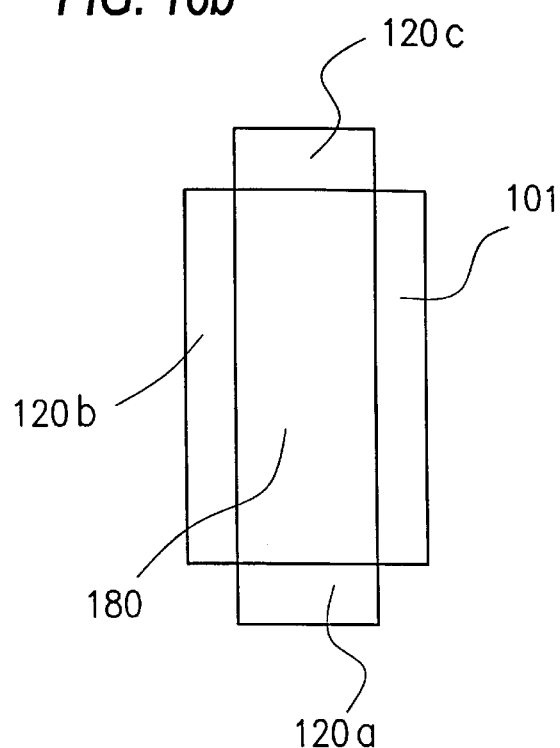

In step 303, any phase shapes (180 degree phase shapes) are stretched by a user-defined 120 phase width, and any areas of the stretched phase shapes which do not overlap a phase shape or a shape (e.g., chrome) are named 120 degree phase shapes. As an illustrative example, FIG. 16*a* depicts a shape 101 and a phase shape 180; FIG. 16*b* depicts the shapes of FIG. 16*a* after the phase shape 180 has been stretched and areas of the stretched phase shape which overlap the shape 101 have been deleted. FIG. 16*b* includes the shape 101, the phase shape 180 and the 120 degree phase shapes 120*a*, 120*b* and 120*c*.

Figure 16C:
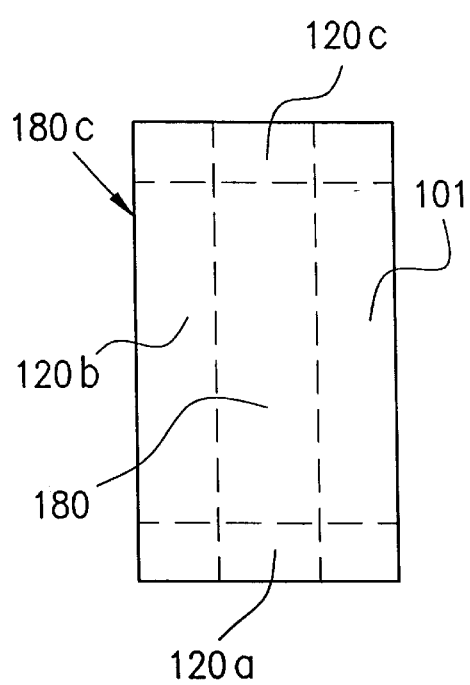
Figure 16D:
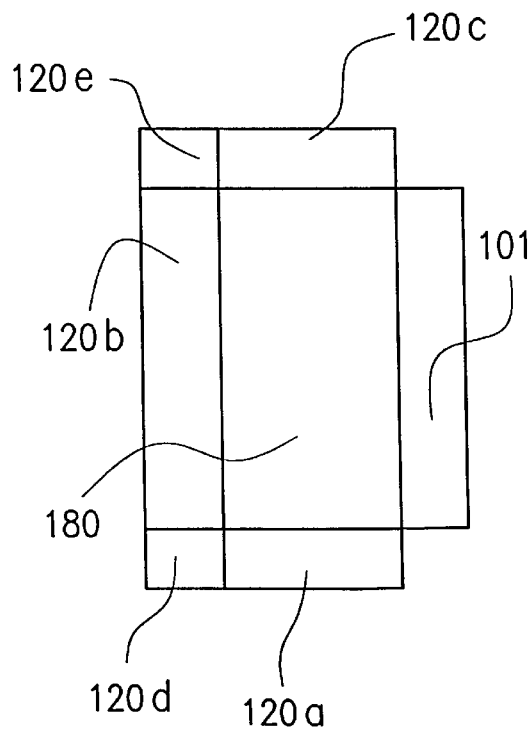
Figure 16F:
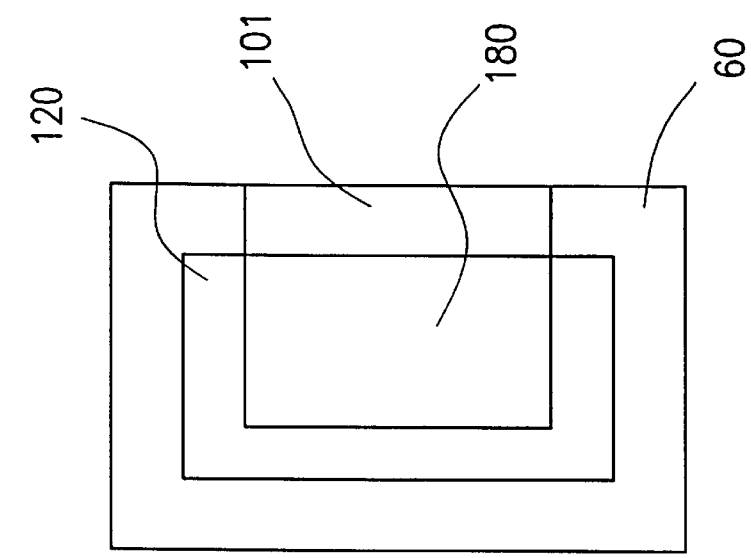

In step 304, the 180 degree phase shapes are grown (as opposed to being stretched) by the user-defined 120 phase width (see 180*c* in FIG. 16*c*), and any portions of the grown shapes which do not overlap a phase shape, a 120 degree phase shape, or a shape (e.g., chrome), are named 120 degree phase corners, and then any 120 degree phase corners that touch two 120 degree phase shapes are renamed 120 degree phase shapes, and any 120 degree phase corners that do not touch a shape (e.g., chrome) are also renamed 120 degree phase shapes, giving FIG. 16*d*, where 120*a*, 120*b*, 120*c*, 120*d* and 120*e* are 120 degree phase shapes.

In step 305, the 120 degree phase shape(s) are grown and then shrunk ("shrunk" being defined herein to mean the inverse of growing, i.e., in which the sides of the shape are decreased in size, but the relative sizes and orientation of the sides of the shape remain the same), so as to remove any notch shapes in the 120 degree phase shapes, and the 120 degree phase shape(s) are shrunk and then grown, so as to remove small pieces.

Figure 16E:
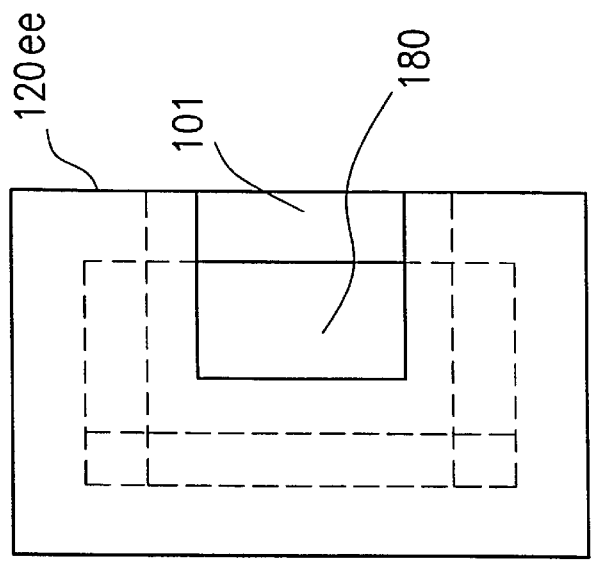

In step 306, the 120 degree phase shape(s) are grown by a user-defined 60 phase width (see 120e in FIG. 16e), and any portions of the grown 120 degree phase shape(s) which do not overlap a 180 degree phase shape, a 120 degree phase shape or a shape, are renamed 60 degree phase shape (see the shape labeled 60 in FIG. 160.

In step 307, the 60 degree phase shape(s) are grown and then shrunk, so as to remove any notch shapes in the 60 degree phase shapes, and the 60 degree phase shape(s) are shrunk and then grown, so as to remove small pieces.

Figure 15:
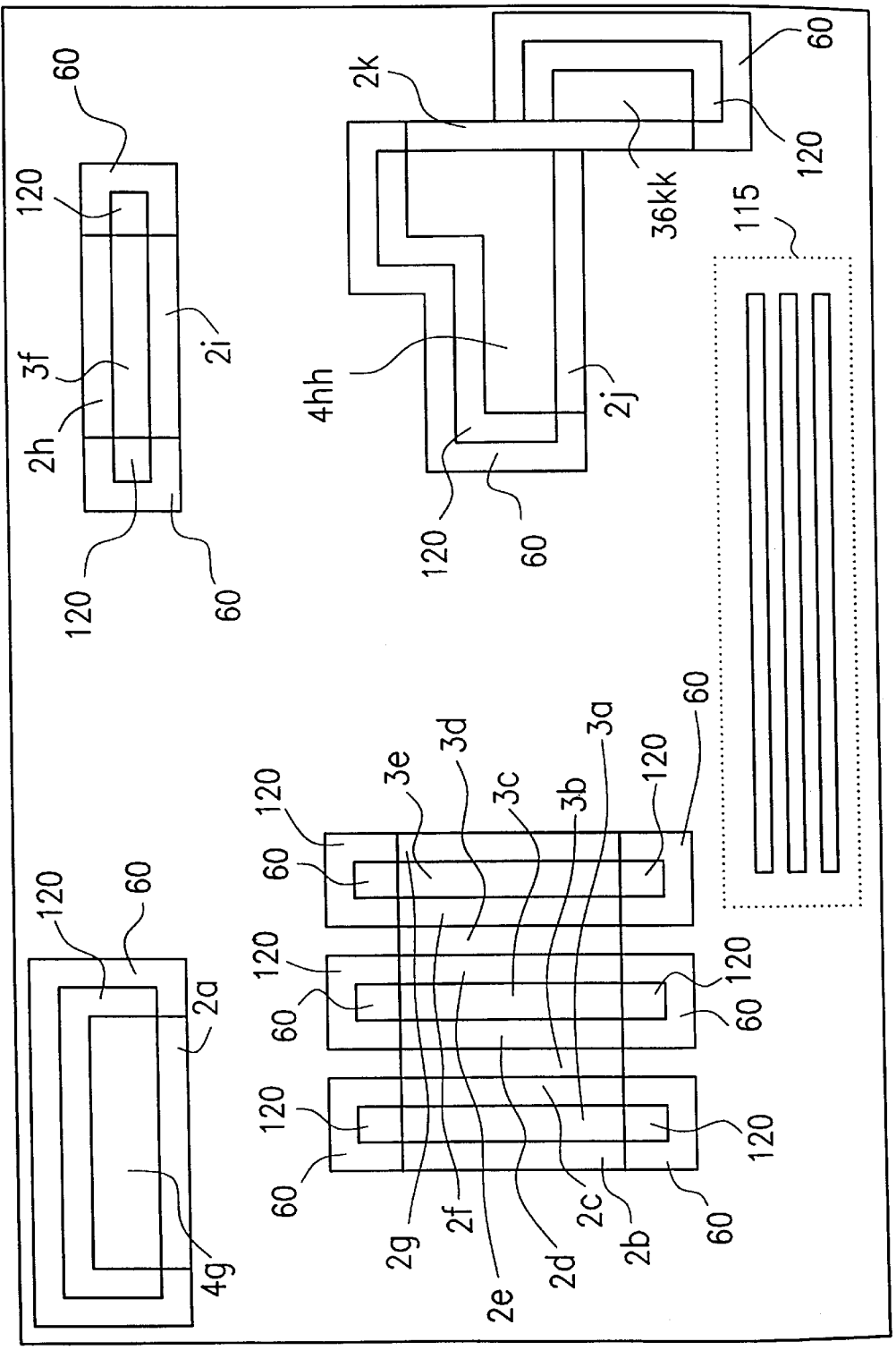

FIG. 15 depicts the shapes of FIG. 14 after 120 degree phase shapes and 60 degree phase shapes have been generated as described above.

The modified reticle layout produced according to the present invention can be sent to a mask shop for manufacture of a reticle according to the modified reticle layout.

Prior to making a mask, the modified reticle layout can be checked to analyze differences between the pattern that will be produced on a resist by exposure through a reticle formed according to the modified reticle layout and the desired circuit feature layout. Depending on those differences, additional modifications can be made to the modified reticle layout, which may include further changes to one or more of the shapes in the layout. Examples of simulation software that can be used to determine the pattern which will be produced on a resist by exposure through a reticle formed according to the modified reticle layout include FAIM by Vector Technologies of Boston, Mass., SPLAT by the University of Berkeley, Calif. and PROLITH by Finle Technologies of Plano, Tex. The modified reticle layout can be further modified and then run through the simulation software again to check for excessive variances. These steps can be repeated until the simulated images correlate with the binary mask layout within the design limits.

After a layout has been phase-shifted as described above, the layout can, if necessary, be run through an optical proximity correction (OPC) program. OPC programs look for specific relationships or aspects in a layout, and where such relationships or aspects occur, make a correction, i.e., add or subtract shapes or parts of shapes to the layout such that the pattern formed by exposure through the reticle more closely corresponds to the desired pattern. A variety of OPC programs are known in the art. Preferably, the OPC program (i) compares the chrome layout, which is the same in the binary and the phase-shifted layouts, to either data obtained through simulations or data obtained from exposed wafers and (ii) moves chrome and phase boundaries to match the layout to the data.

A preferred material for use in making the transparent portions of a reticle is quartz. However, any suitable transparent material, e.g., soda-lime glass, borosilicate glass, or other similar natural or synthetic substances can be used. Those of skill in the art can readily select an appropriate material for use in making the transparent portions of a reticle. Such transparent portions can include the 0 degree and any phase shift regions, e.g., 60 degree, 120 degree and 180 phase shift regions. As discussed above, a single material can be used to provide different phase shift degrees depending on the thickness of the material in the different regions, and/or different-materials and/or layers can be employed in different regions.

A preferred material for use in making opaque portions (if present) of a reticle is chrome, however, any suitable opaque material can be used. Those of skill in the art can readily select an appropriate material for use in making the opaque portions of a reticle.

The present invention is further directed to any sequence of process steps which includes performance of any of the processes in accordance with the present invention, in addition to any other process steps, including but not limited to coating or applying one or more additional layers, removing part of all of one or more additional layers, creating a pattern on a surface of a layer by applying, exposing and developing a photoresist and then removing portions of the layer defined by the pattern, forming interconnect holes through two or more layers, creating interconnects, etc.

Figure 17:
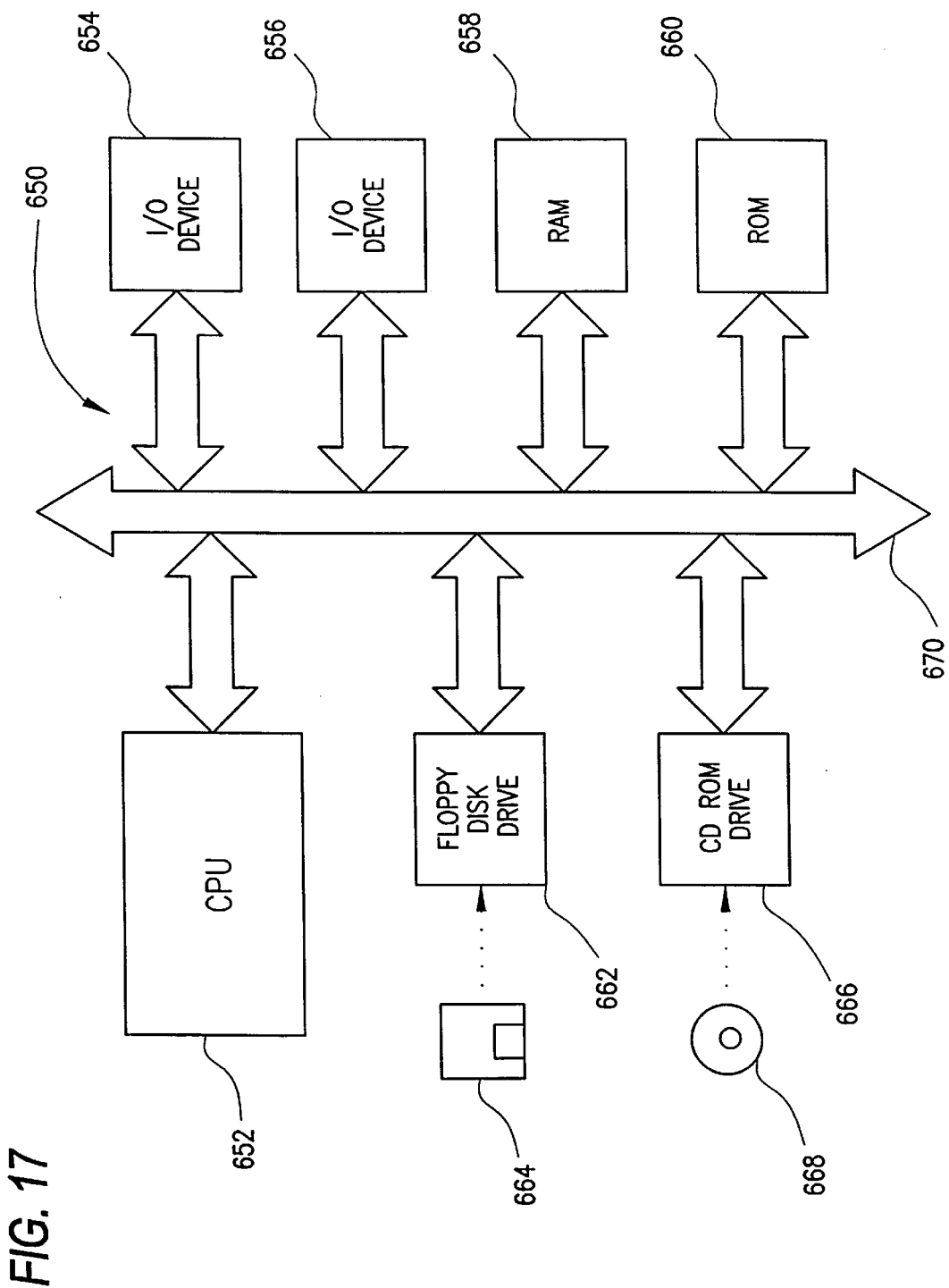
FIG. 17 is a schematic diagram of a computer system in which the process of the present invention can be implemented.

FIG. 17 depicts an example of a computer system 650 in which a process according to the present invention can be implemented. The system 650 includes a central processing unit (CPU) 652 that communicates with an input/output (I/O) device 654 over a bus 670. A second I/O device 656 is illustrated, but is not necessary to practice the present invention. The computer system 650 also includes random access memory (RAM), read only memory (ROM) 660 and may include peripheral devices such as a floppy disk drive 664 or a compact disk read only memory (CD-ROM) drive 666 that also communicate with the CPU 652 over the bus 670. The exact architecture of the computer system 650 is not critical, and any suitable combination of computer compatible devices may be incorporated into the system 650. In a preferred embodiment, the computer system 650 is a UNIX based workstation. Moreover, the program implementing the process of the present invention may be stored in ROM 608, a CD-ROM 668, a floppy disk 664, a hard disk drive, or any other medium capable of storing a computer program and data required by the program. In addition, the computer program or programs used in the process of the present invention may be transmitted over a communications network as downloaded, for example, transmitted from a server computer or another computer connected to the computer system 650 which downloads the program or programs. The process of the present invention can be executed in a distributed manner over several computer systems 650, whether connected by a network or not, to process different tasks associated with formation of a reticle, in parallel fashion. One or more of the features contained in the devices shown in FIG. 17 can be made using reticles designed in accordance with the present invention.

Although the articles and methods in accordance with the present invention have been described in connection with preferred embodiments, it will be appreciated by those skilled in the art that modifications not specifically described may be made without departing from the spirit and scope of the invention. For example, it should be readily apparent that while the embodiment most specifically described herein employs step of stretching shapes in some instances, and steps of growing shapes in others, there are numerous situations where a stretching step could be conducted in place of a growing step, and vice-versa. Accordingly, the invention is not limited by the foregoing description, but is only limited by the scope of the appended claims.

What is claimed is:

1. A method for creating a phase shift mask comprising:
   determining a location of at least one printable shape on a phase shift mask layout;
   generating temporary shapes adjacent to said at least one printable shape;
   designating said generated temporary shapes as phase shapes or zero phase shapes in an alternating manner; and using said phase shapes and said zero phase shapes in forming a phase shift mask.

2. The method of claim 1 further comprising expanding at least one of said designated phase shapes such that said at least one of said designated phase shapes overlaps adjacent said generated temporary shapes.

3. The method of claim 2 wherein said overlapped adjacent generated temporary shapes are zero phase shapes.

4. The method of claim 1 further comprising expanding at least one of said designated zero phase shapes such that said at least one designated zero phase shape overlaps adjacent said generated temporary shapes.

5. The method of claim 4 further comprising repeating said step of expanding said at least one designated zero phase shape until all generated temporary shapes have been designated either phase shape or zero phase shape.

6. A method as in claim 5 further comprising generating temporary shapes on another area of said phase shift mask layout;

selecting at least one said generated temporary shape from said another area of the layout; and designating said at least one generated temporary shape from said another area as a phase shape, and expanding said designated at least one phase shape.

* * * * *

UNITED STATES PATENT AND TRADEMARK OFFICE
CERTIFICATE OF CORRECTION

PATENT NO.     : 6,620,561 B2  Page 1 of 1
DATED          : September 16, 2003
INVENTOR(S)    : Amy A. Winder et al.

It is certified that error appears in the above-identified patent and that said Letters Patent is hereby corrected as shown below:

<u>Title page,</u>
Insert Item:
-- [73]   Assignee: Micron Technology, Inc., Boise, ID (US) --

Signed and Sealed this

Twentieth Day of January, 2004

JON W. DUDAS
*Acting Director of the United States Patent and Trademark Office*